United States Patent
Bayer et al.

(10) Patent No.: US 10,389,407 B2
(45) Date of Patent: Aug. 20, 2019

(54) ELECTRICAL TRANSFORMER TO TRANSMIT DATA AND POWER

(71) Applicant: TEXAS INSTRUMENTS INCORPORATED, Dallas, TX (US)

(72) Inventors: Erich Johann Bayer, Thonhausen (DE); Johann Zipperer, Unterschleißheim (DE); Christophe Vaucourt, Munich (DE); Tobias Bernhard Fritz, Mainburg (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/816,365

(22) Filed: Nov. 17, 2017

(65) Prior Publication Data

US 2019/0158148 A1 May 23, 2019

(51) Int. Cl.
| | |
|---|---|
| *H04B 5/00* | (2006.01) |
| *H04B 1/58* | (2006.01) |
| *H03L 7/08* | (2006.01) |
| *H02J 50/10* | (2016.01) |
| *H02M 3/335* | (2006.01) |

(52) U.S. Cl.
CPC ............ *H04B 5/0031* (2013.01); *H02J 50/10* (2016.02); *H03L 7/0807* (2013.01); *H02M 3/33592* (2013.01)

(58) Field of Classification Search
CPC .... H04B 5/0031; H04B 1/581; H04B 5/0075; H04M 19/003; H02J 50/10; H03L 7/0807; H02M 3/33592; H01F 38/14
See application file for complete search history.

(56) References Cited

U.S. PATENT DOCUMENTS

| | | | |
|---|---|---|---|
| 4,473,816 A | 9/1984 | Perkins | |
| 4,556,865 A | 12/1985 | Fukagawa et al. | |
| 6,496,105 B2 | 12/2002 | Fisher et al. | |
| 6,603,805 B1* | 8/2003 | Hisano | H04L 25/0266 375/219 |
| 6,897,764 B2 | 5/2005 | Cern | |
| 7,042,351 B2 | 5/2006 | Kline | |
| 9,088,220 B2 | 7/2015 | Bavel | |
| 2007/0076626 A1* | 4/2007 | Wise | H04L 1/1825 370/252 |
| 2007/0115697 A1* | 5/2007 | Ando | H02M 1/14 363/16 |

(Continued)

FOREIGN PATENT DOCUMENTS

| | | |
|---|---|---|
| WO | 199113417 A1 | 9/1991 |
| WO | 2004010083 A2 | 1/2004 |

*Primary Examiner* — Andrew Wendell
(74) *Attorney, Agent, or Firm* — Michael A. Davis, Jr.; Charles A. Brill; Frank D. Cimino

(57) ABSTRACT

In described examples, a system includes a transformer including a primary winding and a secondary winding. The system also includes a primary side circuit coupled to the primary winding of the transformer. The primary side circuit includes a primary controller. The system further includes a secondary side circuit coupled to the secondary winding of the transformer. The primary controller coupled to cause the primary side circuit to transfer power and intermittently transmit data to the secondary side circuit via the primary winding and the secondary winding of the transformer.

17 Claims, 12 Drawing Sheets

(56) References Cited

U.S. PATENT DOCUMENTS

| | | | |
|---|---|---|---|
| 2012/0236614 A1* | 9/2012 | Kamata | H02M 1/32 363/131 |
| 2012/0250588 A1 | 10/2012 | Morong | |
| 2015/0145473 A1* | 5/2015 | Shen | H02J 7/007 320/108 |
| 2015/0236759 A1* | 8/2015 | Cornell | H04B 5/0093 375/256 |
| 2015/0280573 A1* | 10/2015 | Gong | H02M 3/33523 363/21.14 |
| 2016/0330099 A1* | 11/2016 | Koo | H04L 43/0894 |
| 2017/0033698 A1* | 2/2017 | Vemuri | H02M 3/33592 |
| 2017/0250612 A1* | 8/2017 | Malinin | H02M 3/33507 |
| 2017/0358993 A1* | 12/2017 | Ragonese | H02M 3/33553 |
| 2017/0366044 A1* | 12/2017 | Tao | H02M 7/487 |

\* cited by examiner

ELECTRICAL TRANSFORMER TO TRANSMIT DATA AND POWER

TECHNICAL FIELD

This relates generally to an electrical circuit with a transformer to transmit data and power.

BACKGROUND

A transformer is an electrical device that transfers electrical energy between two or more circuits through electromagnetic induction. A varying current in one winding (e.g., inductor or coil) of the transformer produces a varying magnetic field, which in turn induces a voltage in a second winding. Power is transferred between the two windings through the magnetic field, without a metallic connection between the two circuits. Transformers may be used to increase or decrease the alternating voltages in electric power applications.

In electronics and telecommunications, modulation is the process of varying one or more properties of a periodic waveform, called the carrier signal, with a modulating signal that typically contains information to be transmitted.

SUMMARY

In a first example, a system includes a transformer that includes a primary winding and a secondary winding. The system also includes a primary side circuit coupled to the primary winding of the transformer. The primary side circuit includes a primary controller. The system further includes a secondary side circuit coupled to the secondary winding of the transformer. The primary controller is coupled to cause the primary side circuit to transfer power and intermittently transmit data to the secondary side circuit via the primary winding and the secondary winding of the transformer.

In a second example, a system includes a transformer having a primary winding and a secondary winding and a primary side circuit coupled to the primary winding of the transformer. The primary side circuit includes a primary controller and a clock generator coupled to output a given pair of signals oscillating at a predetermined frequency. The system also includes a secondary side circuit coupled to the secondary winding of the transformer. The secondary side circuit includes a secondary controller and a clock recovery circuit coupled to output another pair of signals oscillating at the predetermined frequency. The primary side circuit is coupled to transfer power to the secondary side circuit via the transformer. Additionally, the primary controller coupled to intermittently cause a short at the primary winding to indicate a transmission of data to the secondary controller via the transformer and the secondary controller is coupled to intermittently cause a short at the secondary winding to indicate a transmission of data to the primary controller via the transformer.

In a third example, a method includes transferring power from a given winding of a transformer to another winding of a transformer. The method also includes shorting the given winding of the transformer to induce a rapidly rising current on the other winding of the transformer and transmitting data from the given winding to the other winding during a data transmission window that is opened in response to the rapidly induced rising current.

DETAILED DESCRIPTION

This disclosure describes systems and methods for isolated power transfer and data transmission over the same transformer. In particular, in a power transfer mode, power is transferred from a primary winding to a secondary winding (or vice versa) with a driver (e.g., a half-wave or full-wave driver) operating on the primary side of the transformer and a rectifier (e.g., a half-wave or full-wave rectifier) operating on a secondary side of the transformer.

Intermittently, a given controller modulates data across the transformer. For example, the given controller applies shorts to a given transformer winding (e.g., one of the primary winding or the secondary winding) that induces a rapidly rising current in another transformer winding (e.g., the other of the primary winding or the secondary winding). The rapidly rising current on the other winding of the transformer is detected by another controller, which indicates that a data transmission window is open for a duration (e.g., a predetermined number of clock cycles) corresponding to a data transmission mode.

During the data transmission window, the given controller transmits data to the other controller via the transformer. Additionally, in some examples, to achieve higher power efficiency and/or greater throughput, the other controller may apply a short to the other transformer winding. Upon expiration of the predetermined number of clock cycles, both the given and the other winding of the transformer are de-shorted to terminate the data transmission mode, and the system returns to the power transfer mode.

Figure 1:
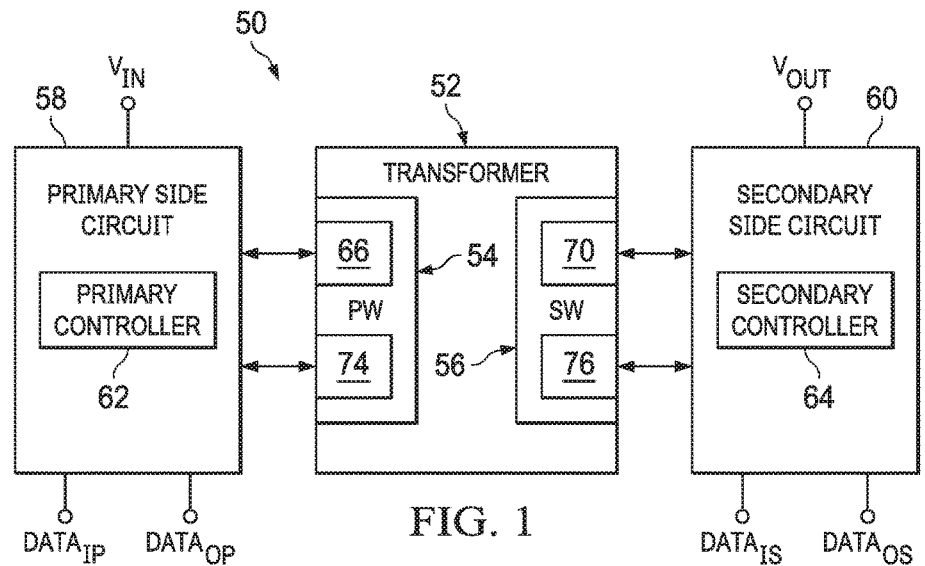
FIG. 1 is a diagram of an example of a system for transferring power and transmitting data over a transformer.

FIG. 1 is a block diagram of a system 50 for transferring power and transmitting data over a transformer 52. The transformer 52 includes a primary winding 54 and a secondary winding 56. A primary side circuit 58 is coupled to the primary winding 54 and a secondary side circuit 60 is coupled the secondary winding 56. The transformer 52 provides galvanic isolation and electro-magnetic coupling between the primary side circuit 58 and the secondary side circuit 60.

In at least one example, the primary side circuit 58 is implemented as an integrated circuit (IC) chip. In other examples, some (or all) of the components of the primary side circuit 58 are implemented as discrete circuit components. The primary side circuit 58 includes circuit components (e.g., resistors, capacitors, inductors and switches) that are controlled by a primary controller 62. In at least one example, primary controller 62 is implemented as a microcontroller (e.g., a microprocessor with embedded machine-readable instructions). In other examples, the primary controller is implemented as hard-wired or programmable logic.

In some examples, the secondary side circuit 60 is implemented in a manner similar to the primary side circuit 58. That is, in at least one example, the secondary side circuit 60 is also implemented as an IC chip. In other examples, some (or all) of the components of the secondary side circuit 60 are implemented as discrete circuit components. The secondary side circuit 60 includes a secondary controller 64 that controls the circuit components of the secondary side circuit 60.

The system 50 operates in a plurality of different modes. In particular, the system 50 can operate in a power transfer mode in a synchronous rectification operation. In one example of the power transfer mode, power is transferred from the primary side circuit 58 to the secondary side circuit 60. In another example, in the power transfer mode, power is transferred from the secondary side circuit 60 to the primary side circuit 58. For purposes of simplification of explanation, it is presumed that in the power transfer mode, power is transferred from the primary side circuit 58 to the secondary side circuit 60.

The primary side circuit 58 receives an input signal, $V_{IN}$. The input signal, $V_{IN}$ is a direct-current (DC) voltage signal. In the power transfer mode, the primary controller 62 controls the primary side circuit 58 to operate as a half-bridge driver that applies a primary driver signal (e.g., a square wave) to a first node 66 of a primary winding 54 of the transformer 52. Application of the primary driver signal induces a current at a first node 70 of a secondary winding 56 of the transformer 52. The current at the first node 70 of the secondary winding 56 is provided to the secondary side circuit 60. The secondary controller 64 controls a rectifier in the secondary side circuit 60 to generate an output signal, $V_{OUT}$.

The primary controller 62 and the secondary controller 64 each control clock signals that operate in a phase-locked loop (PLL). In this manner, the clock signal of the primary side circuit 58 and the secondary side circuit 60 have the same frequency. Thus, in examples where a number of turns in the primary winding 54 and the secondary winding 56 are equal, the output signal, $V_{OUT}$ is about equal to the input signal $V_{IN}$. In other examples, the number of turns in the primary winding 54 and the secondary winding 56 are unequal. In such a situation, the output signal, $V_{OUT}$ is greater than or less than the input signal, $V_{IN}$. Accordingly, in the power transfer mode, the primary side circuit 58 and the secondary side circuit 60 co-operate to execute a synchronous rectification operation.

Additionally, intermittently, the system 50 operates in a primary data transmission mode. In the primary data transmission mode, data is transferred from the primary side circuit 58 to the secondary side circuit 60 via the transformer 52. To initiate the primary data transmission mode, the primary controller 62 requests opening of a data window.

To request opening of a data window, the primary controller 62 causes the primary side circuit 58 to short (e.g., "short circuit") the first node 66 of the primary winding 54 with a second node 74 of the primary winding 54. As used herein, the term "short", "short circuit" or its derivatives denotes an electrical circuit of significantly lower electrical resistance (e.g., near '0'Ω) than that of the resistance during operation in the power transfer mode. For example, while the resistance during the short circuit condition between nodes 66 and 74 is to approximate 0Ω, there may be some incidental resistance due to the electrical path (e.g., a switch device and one or more electrical conductors, such as wires or traces) between such nodes. The substantial shorting of the first node 66 with the second node 74 of the primary winding 54 induces a rapidly rising current at the first node 70 of the secondary winding 56. The secondary side circuit 60 includes components for detecting the rapidly rising current that provides a signal to the secondary controller 64 indicating that the request for the data transmission window has been received.

In response to the request for the opening of the data transmission window, the secondary controller 64 opens the data transmission window for a predetermined amount of time (e.g., a predetermined number of clock cycles). In some examples, the secondary controller 64 can also execute an echo operation that causes a short between the first node 70 and a second node 76 of the secondary winding 56. In this manner, the secondary winding 56 is shorted after the shorting of the primary winding 54 such that the state of the secondary winding 56 "echoes" the state of the primary winding 54. As explained herein, the echo operation improves power efficiency and/or data throughput of the system 50.

Upon opening of the data transmission window, the primary controller 62 modulates the signal provided to the first node 66 of the primary winding 54 to encode data provided on a primary data input signal, $DATA_{IP}$. The data is received at the secondary controller 64. In at least one example, the secondary controller 64 decodes the data and provides the decoded data on a secondary data output signal, $DATA_{OS}$. In another example, the secondary controller 64 employs the received data for local processing. Upon expiration of the predetermined amount of time, the primary controller 62 causes the primary side circuit 58 to de-short the primary winding 54. As used herein, the term "de-short" denotes returning the resistance between first and second nodes of the winding (the primary winding 54 or the secondary winding 56) to the resistance at the power transfer mode. Additionally, in at least one example, the secondary controller 64 causes the secondary side circuit 60 to de-short the secondary winding 56, thereby closing the data transmission window. Moreover, the system 50 returns to the power transfer mode.

The system 50 is symmetrical. Accordingly, the transformer 52 allows bi-directional data communication between the primary side circuit 58 and the secondary side circuit 60. Thus, the system 50 can operate in the secondary data transmission mode. In the secondary data transmission mode, data is transferred from the secondary side circuit 60 to the primary side circuit 58 via the transformer 52.

In the secondary data transmission mode, the secondary controller 64 can request opening of a data transmission window. To request opening of a data window, the secondary controller 64 causes the secondary side circuit 60 to short the first node 70 of the secondary winding 56 with the second node 76 of the secondary winding 56. The shorting of the first node 70 with the second node 76 of the secondary winding 56 induces a rapidly rising current at the first node 66 of the primary winding 54. The primary side circuit 58 includes components for detecting the rapidly rising current that provides a signal to the primary controller 62 indicating that the request for the data transmission window has been received.

In response to the request for opening the data transmission window, the primary controller 62 opens the data transmission window for a predetermined amount of time (e.g., a predetermined number of clock cycles). In some examples, the primary controller 62 can also execute an echo operation that causes a short between the first node 66 and a second node 74 of the primary winding 54. In this manner, the primary winding 54 is shorted after the shorting of the secondary winding 56 such that the state of the primary winding 54 "echoes" the state of the primary winding 54. As noted, the echo operation improves power efficiency and/or data throughput of the system 50.

Upon opening of the data transmission window, the secondary controller 64 modulates the signal provided to the first node 70 of the secondary winding 56 to encode data provided on a secondary data input signal, $DATA_{IS}$. The data is received at the primary controller 62. In at least one example, the primary controller 62 decodes the data and provides the decoded data on a primary data output signal, $DATA_{OP}$. In another example, the primary controller 62 employs the received data for local processing. Upon expiration of the predetermined amount of time, the secondary controller 64 causes the primary side circuit 58 to de-short the primary winding 54. Additionally, in at least one example, the primary controller 62 causes the primary side circuit 58 to de-short the primary winding 54, thereby closing the data transmission window. Moreover, the system 50 returns to the power transfer mode.

By employment of the system 50, the same transformer 52 is employable for both power transfer and bi-directional data communication. In this manner, the need for a separate couplers for transferring power and transmitting data is obviated. Thus, the system 50 can achieve space and cost savings by eliminating the need for a (relatively large and expensive) second transformer and/or optical coupler.

Figure 2:
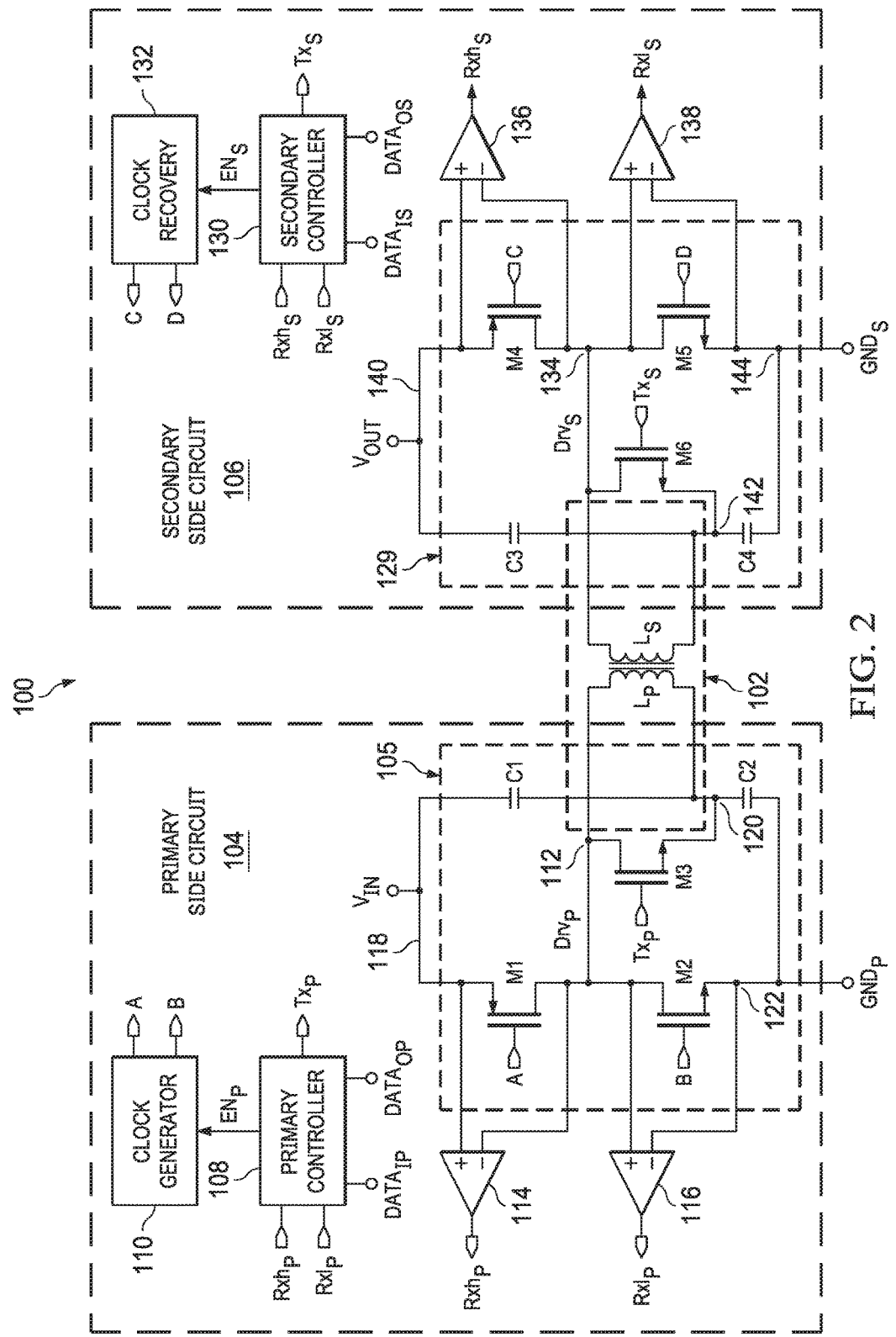
FIG. 2 is a circuit diagram of an example of a system for transferring power and transmitting data over a transformer.

FIG. 2 is a circuit diagram of a system 100 for transferring power and transmitting data over a transformer 102. In at least one example, the system 100 is employed to implement the system 50 of FIG. 1. The system 100 includes a primary side circuit 104 and a secondary side circuit 106. In at least one example, components of the primary side circuit 104 and the secondary side circuit 106 are implemented on respective first and second IC chips. In other examples, some (or all) of the components of the primary side circuit 104 and/or the secondary side circuit 106 are implemented as discrete circuit components. Additionally, in at least one example, the transformer 102 is implemented on a third IC chip. In at least one other example, the transformer is implemented as a discrete circuit component. The transformer 102 provides galvanic isolation and electromagnetic coupling between the primary side circuit 104 and the secondary side circuit 106.

For purposes of simplification of explanation, the system 100 is illustrated and described as employing a p-channel enhancement mode metal oxide semiconductor field effect transistors (PMOSs) and n-channel enhancement mode metal oxide semiconductor field effect transistors (NMOSs) that operate as electrically controlled switches. However, it is understood that in other examples, other types of transistors, such as PNP and NPN bipolar junction transistors (BJTs) or other type of electric switches (e.g., solid-state relays) could be alternatively employed.

The system 100 operates in multiple modes of operation. In a power transfer mode, the primary side circuit 104 transfers power to the secondary side circuit 106 via the transformer 102. The system 100 is symmetric. Accordingly, in at least one other example, the secondary side circuit 106 transfers power to the primary side circuit 104 via the transformer 102. However, for purposes of simplification of explanation, it is presumed that in the power transfer mode, the power is transferred from the primary side circuit 104 to the secondary side circuit 106.

In the examples described, it is presumed that a primary winding $L_P$ and a secondary winding $L_S$ of the transformer 102 have equal number of turns. However, in other examples, the primary winding $L_P$ and the secondary winding $L_S$ of the transformer 102 may have a different number of turns. As used herein, the term "high side" denotes a positive voltage applied to the transformer 102 and the term "low side" denotes a negative voltage or neutral voltage applied to the transformer 102.

Additionally, the system 100 also operates in a primary data transmit mode and a secondary data transmit mode. Accordingly, as described herein, bi-directional data is transmitted between the primary side circuit 104 and the secondary side circuit 106 via the transformer 102.

The primary side circuit 104 includes a half-wave driver 105 that is controlled by a primary controller 108 and a clock generator 110. To transfer power, the primary controller 108 asserts (e.g., sets to a logical '1') an enable signal (labeled in FIG. 2 as "$EN_P$") to the clock generator 110. In response, the clock generator 110 generates two square wave signals, A and B at a predetermined power transfer frequency. In at least one example, the power transfer frequency of A and B is set based on physical properties of the transformer 102. Moreover, in at least one example, the signals, A and B have the same (or nearly the same waveform) when operating in the power transfer mode.

As used herein, the term "logical '1'" denotes a high voltage state (e.g., about 3-5 V) and the term "logical '0'" denotes a low voltage state (e.g., about '0' V). As explained, the effects of the logical '0' or logical '1' vary based on the type of device that receives the logical '0' or logical '1'.

In at least one example, the primary side circuit 104 includes a PMOS M1 and an NMOS M2. In at least one example, the signal A (output by the clock generator 110) is coupled to a gate (a control node) of the PMOS M1 and the signal B (also output by the clock generator 110) coupled to a gate of the NMOS M2. A drain (e.g., an output node) of the PMOS M1 and a drain (e.g., an input node) of the NMOS M2 is coupled to a first primary side node 112 on a primary winding $L_P$ of the transformer 102. In the examples described herein, the components of the primary side circuit 104 induce a primary driver signal, $Drv_P$ at the first primary side node 112.

In at least one example, the first primary side node 112 is also coupled to a drain of an NMOS M3, an inverting input of a primary high side detector implemented as an operational amplifier (op-amp) 114 and to a non-inverting input of a primary low side op-amp 116. A non-inverting input of the primary high side op-amp 114 is coupled to a power input node 118 of the primary side circuit 104. Moreover, throughout this disclosure, although op-amps are illustrated, in other examples, other types of detectors could be employed in place of the illustrated and described op-amps.

The power input node 118 is coupled to an input voltage, $V_{IN}$. In at least one example, the input voltage, $V_{IN}$ is a direct current (DC) voltage. The power input node 118 is also coupled to a source (e.g., an input node) of the PMOS M1 and to a capacitor C1. The capacitor C1 is also coupled to a second primary side node 120 of the primary winding $L_P$ of the transformer 102. The second primary side node 120 is also coupled another capacitor C2 and to a source of the NMOS M3. In at one example, the capacitors C1 and C2 have the same capacitance. Moreover, the capacitance of C1 and C2 are based on the power transfer frequency.

The capacitor C2 is also coupled to a primary side common node 122. The primary side common node 122 is coupled to an electrically neutral node, $GND_P$ (e.g., ground or chassis ground). The primary side common node 122 is also coupled to a source (e.g., an output node) of the NMOS M2 and to an inverting input of the primary low side op-amp 116.

The primary controller 108 outputs a signal, $TX_P$ (a primary side data transmission signal) for transmitting data to the secondary side circuit 106. In some examples, the primary controller 108 receives an input data signal, $DATA_{IP}$ that includes encoded data. The signal $TX_P$ is coupled to a gate of the NMOS M3. Additionally, in at least some examples, an output of the primary high side op-amp 114, a primary high data receive signal, $Rxh_p$ and an output of the primary low side op-amp 116, a primary low data receive signal, $Rxl_p$ is provided to the primary controller 108.

The secondary side circuit 106 is configured in a manner similar to the primary side circuit 104. In particular, the secondary side circuit 106 includes a half-wave rectifier 129 that is controlled by a secondary controller 130 and a clock recovery circuit 132. The secondary controller 130 asserts (e.g., as a logical '1') an enable signal, $EN_S$ that is provided to the clock recovery circuit 132. In response, the clock recovery circuit 132 outputs two square wave signals, C and D that oscillate at the power frequency. In at least one example, in the power transfer mode, the signals C and D have the same (or nearly the same) waveform.

The primary controller 108 and the secondary controller 130 operate in a PLL relationship. That is, the both primary controller 108 and the secondary controller 130 have a clock signal (or multiple clock signals) that have an equal or nearly equal frequency. In this manner, the primary side circuit 104 and the secondary side circuit 106 that are controlled by the primary controller 108 and the secondary controller 130 operate in a synchronized relationship. In this manner, the clock generator 110 of the primary side circuit 104 and the clock recovery circuit 132 of the secondary side circuit 106 operate in the PLL relationship. Accordingly, in the power transfer mode, the signals A and B have the same (or nearly the same) frequency as the signals C and D.

In at least one example, the signal C (provided from the clock recovery circuit 132) is coupled to a gate (e.g., a control node) of a PMOS M4. Additionally, the signal D is applied to a gate of an NMOS M5. A drain (e.g., an output node) of the PMOS M4 and a drain (e.g., an input node) of the NMOS M5 is coupled to a first secondary side node 134 of a secondary winding $L_S$ of the transformer 102.

In at least one example, the first secondary side node 134 is also coupled to an inverting input of a secondary high side op-amp 136 and to a non-inverting input of a secondary low side op-amp 138. The first secondary side node 134 is also coupled to a drain (e.g., an input node) of an NMOS M6. In the examples described herein, the components of the transformer 102 and the secondary side circuit 106 induce a secondary driver signal, $Drv_S$ on the first secondary side node 134.

A non-inverting input of the secondary high side op-amp 136 is coupled to a power output node 140 of the secondary side circuit 106. The power output node 140 provides an output power signal, $V_{OUT}$. The power output node 140 is also coupled to a source (e.g., an input node) of the PMOS M4 and to a capacitor C3. The capacitor C3 is also coupled to a second secondary side node 142 of the secondary winding $L_S$. The second secondary side node 142 is coupled to a source (e.g., an output node) of the NMOS M6 and to a capacitor C4. In at least one example, the capacitors C3 and C4 have about the same capacitance, which is based on the power transfer frequency.

The capacitor C2 is also coupled to a secondary side common node 144. The secondary side common node 144 is coupled to an electrically neutral node, $GND_S$ (e.g., ground or chassis ground). The secondary side common node 144 is also coupled to a source (e.g., an output node) of the NMOS M2 and to an inverting input of the secondary low side op-amp 138.

The secondary controller 130 outputs a signal, $TX_S$ (a secondary side data transmission signal) for transmitting data to the primary side circuit 104. The signal $TX_S$ is coupled to a gate of the NMOS M6. In some examples, the secondary controller 130 receives encoded data on an input signal, $DATA_{IS}$. Additionally, in at least some examples, an output of the primary high side op-amp 114, a secondary high data receive signal, $Rxh_S$ and an output of the primary low side op-amp 116, a secondary low data receive signal, $Rxl_s$ is provided to the primary controller 108.

As noted, the system 100 can operate in different modes of operation. During the power transfer mode, the NMOSs M3 and M6 are turned off (operating in the cutoff mode). Moreover, application of the input voltage, $V_{IN}$ causes the capacitors C1 and C2 to charge the second primary side node 120 of the primary winding $L_P$ to a voltage level of about one-half of the input voltage, $V_{IN}$ ($V_{IN}/2$). Moreover, as noted, it is presumed that the turns in the primary winding $L_P$ and the secondary winding $L_S$ are equal. Thus, an approximately equal voltage of $V_{IN}/2$ is induced at the second secondary side node 142 of the secondary winding $L_S$.

Figure 3:
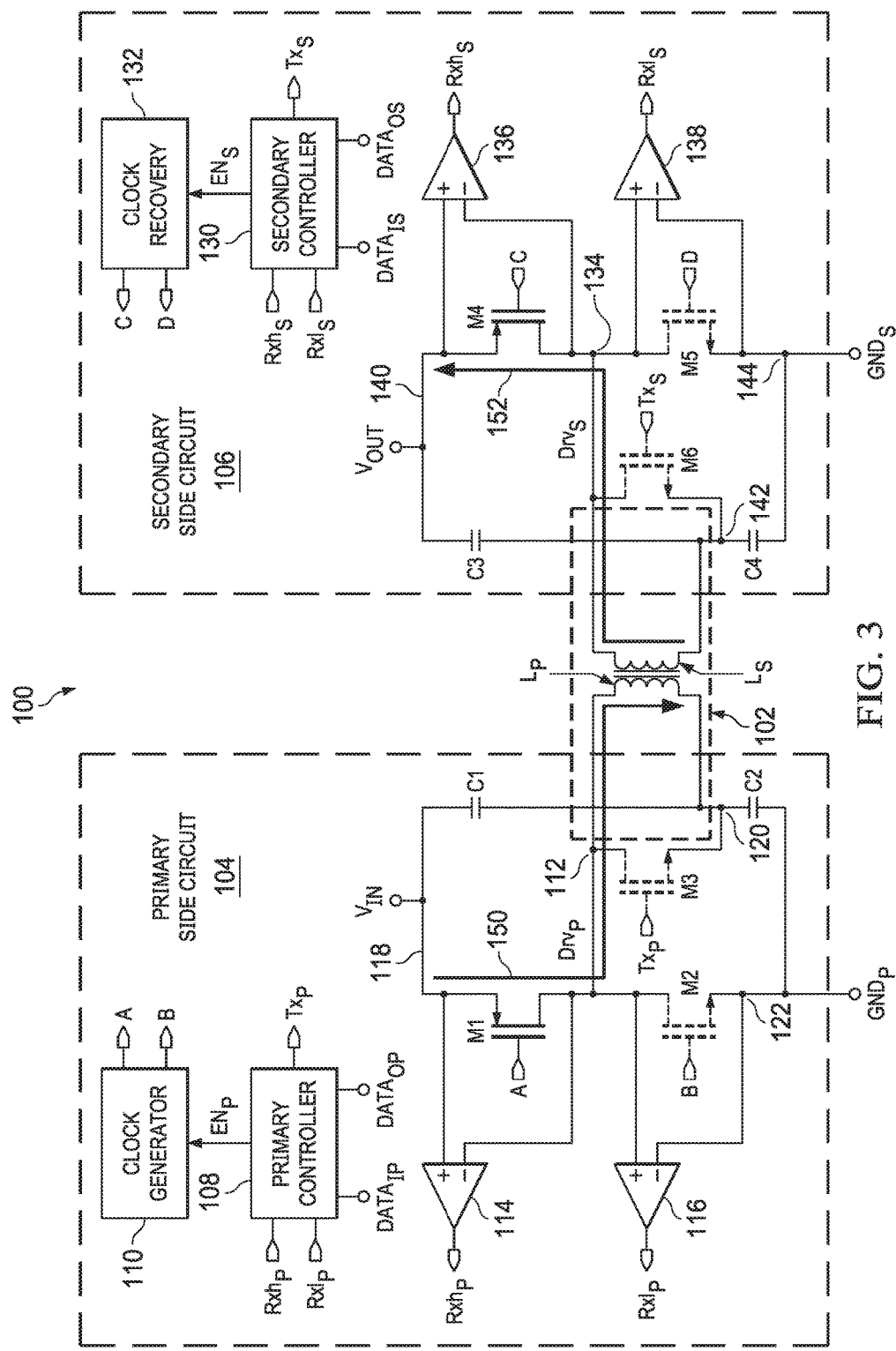
FIG. 3 is a circuit diagram of the system in FIG. 2 operating in a power transfer mode.
Figure 4:
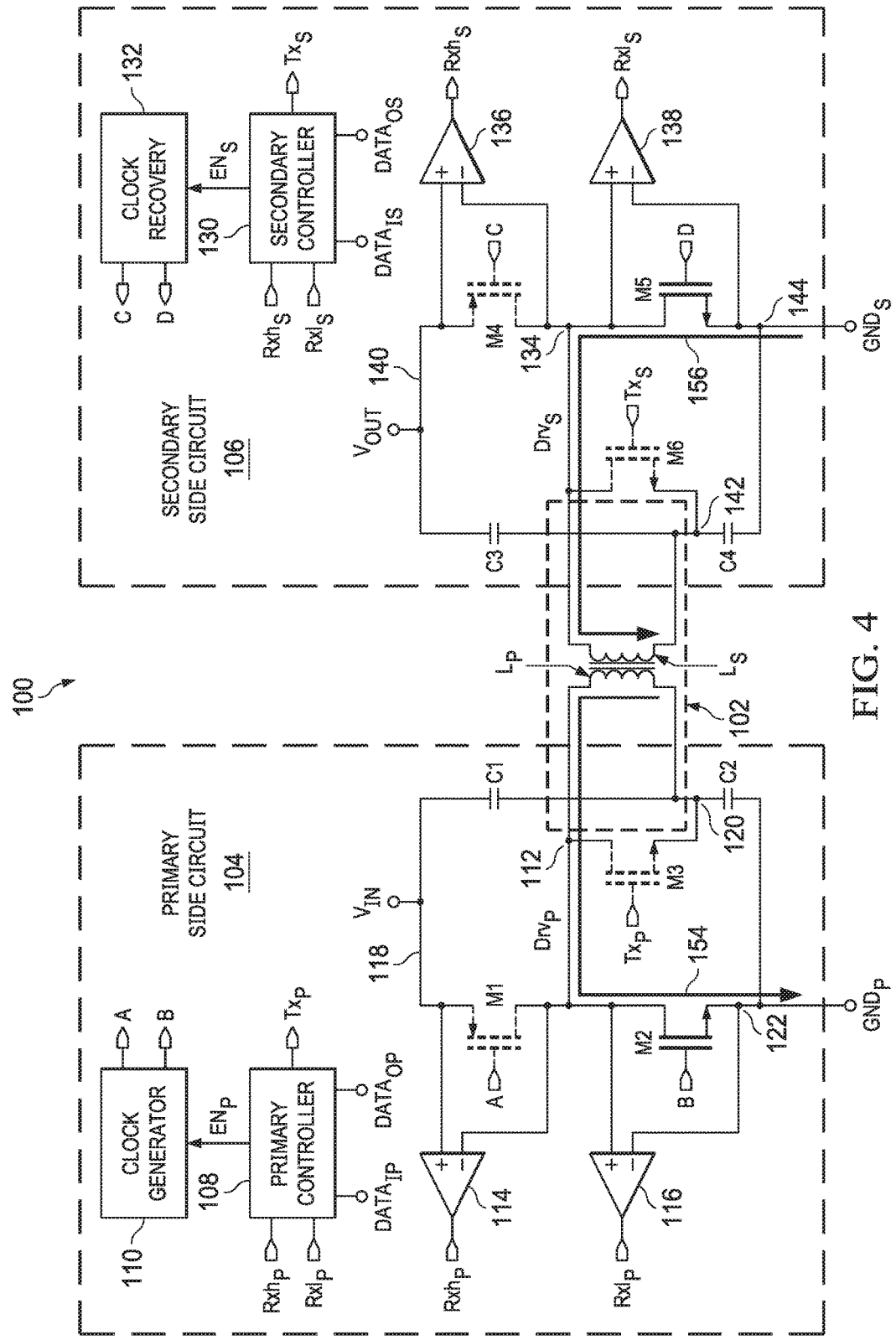
FIG. 4 is another circuit diagram of the system in FIG. 2 operating in the power transfer mode.

More particularly, FIGS. 3 and 4 illustrate the system 100 operating in the power transfer mode. For purposes of simplification of explanation, transistors (NMOSs or PMOSs) that are turned off (operating in the cutoff mode) are illustrated with dotted lines to illustrate current flow. Similarly, to illustrate the current flow, transistors (NMOSs or PMOSs) are illustrated with solid lines are turned on (operating in saturation mode). In the operation illustrated by FIGS. 3 and 4 it is presumed that the system 100 is configured such that the output voltage, $V_{OUT}$ is about equal to the input voltage $V_{IN}$. However, in other examples, the $V_{OUT}$ and $V_{IN}$ may be different voltage levels.

FIG. 3 illustrates the system 100 operating in the power transfer mode during a high side (positive voltage half-cycle) power transfer. During the high side power transfer, the PMOS M1 is turned on by the signal A, and the NMOS M2 is turned off by the signal B, driving current to flow in the manner illustrated by the line 150. As noted, during the power transfer mode, the second primary side node 120 is at a level of about one-half of the input voltage, $V_{IN}$, namely $V_{IN}/2$. Moreover, turning on the PMOS M1 and turning off the NMOS M2 drives the primary driver signal, $Drv_P$ to a level of about the input voltage $V_{IN}$. As noted, in the power transfer mode, the second primary side node 120 is about one-half the input voltage, $V_{IN}/2$. Accordingly, the voltage difference between the voltage at the first primary side node 112 and the second primary side node 120 induces a voltage drop of about one-half the input voltage, $V_{IN}/2$ across the primary winding $L_P$. This voltage drop drives the current indicated by the line 150 that increases at a rate defined by the voltage drop across the primary winding $L_P$ (about $V_{IN}/2$) and the inductance of the primary winding $L_P$.

The rising current across the primary winding $L_P$ induces a current on the secondary winding $L_S$, and this current is denoted by a line 152. As noted, signals C and D output by the clock recovery circuit 132 oscillate at the same frequency (the power transfer frequency) as signals A and B that are output by the clock generator 110. Thus, during the high side power transfer, NMOS M5 is turned off (e.g., operating in the cutoff mode) and PMOS M4 is turned off (operating in the saturation mode). Additionally, NMOS M6 is also turned off. Thus, the flow of current induced on the secondary winding $L_S$ is indicated by the line 152. As noted, a voltage of about one-half the input voltage ($V_{IN}/2$) is present at the second secondary side node 142. Accordingly, the secondary driver signal, $Drv_S$ is driven to a level of about the input voltage, $V_{IN}$. Since the PMOS M4 is turned on (e.g., operating in the saturation mode), the power output node 140, which provides the output signal, $V_{OUT}$ is driven to about the same level as the secondary driver signal, $Drv_S$, which is about equal to the input voltage $V_{IN}$.

FIG. 4 illustrates the system 100 operating in the power transfer mode during a low side (neutral or negative voltage half-cycle) power transfer. During the low side power transfer, in the primary side circuit 104, the PMOS M1 is turned off by signal B and NMOS M2 is turned on by signal A. Additionally, the NMOS M3 is turned off.

As noted, the second primary side node 120 of the primary winding $L_P$ has a voltage level of about one-half of the input voltage, ($V_{IN}/2$). Turning off the PMOS M1 and turning on NMOS M2 couples the first primary side node 112 of the primary winding $L_P$ to about the level of the primary side common node 122 (e.g., about $GND_P$ or '0' volts). Accordingly, a voltage drop of about one-half of the input voltage, ($V_{IN}/2$) with is induced over the primary winding $L_P$. The voltage drop induces a decreasing current flowing in a direction indicated by a line 154. This current decreases at a rate defined by $V_{IN}/2$ and the inductance of the primary winding $L_P$.

As noted, the second secondary side node 142 has a voltage of about one-half the input voltage ($V_{IN}/2$). In the secondary side circuit, the PMOS M4 is turned off by signal C and the NMOS M5 is turned on by signal D, wherein signals C and D are output by the clock recovery circuit 132. Additionally, the NMOS M6 is turned off by the secondary data transmit signal, $Tx_S$. Accordingly, the secondary driver signal, $Drv_s$ is driven to a level of about the secondary side common node 144 (about $GND_S$ or about '0' volts). Thus, the decreasing current on the primary side circuit 104 indicated by the line 154 induces a corresponding decreasing current on the secondary side circuit 106 that is indicated by a line 156. The current decreases at a rate defined by the capacitors C3 and C4 and the inductance of the secondary winding $L_S$. Moreover, the power output node 140 coupled to the output voltage, $V_{OUT}$ decreases at a rate corresponding to the rate of the decreasing current indicated by the line 156.

Based on the changing output of signals A and B from the clock generator 110 and the signals C and D of the clock recovery circuit 132, in the power transfer mode, the system 100 oscillates between a state illustrated in FIG. 3 to a state illustrated in FIG. 4. This oscillation allows power transfer from the primary side circuit 104 to the secondary side circuit 106. In this manner, the PMOS M4 and the NMOS M5 operate as a rectifier of the secondary driving signal, $Drv_S$. In particular, in at least one example, the primary side circuit 104 and the secondary side circuit 106 are designed such that the output signal, $V_{OUT}$ is about equal to the input signal $V_{IN}$. Accordingly, the primary side circuit 104 and the secondary side circuit 106 co-operate to execute a synchronous rectification operation.

Figure 5:
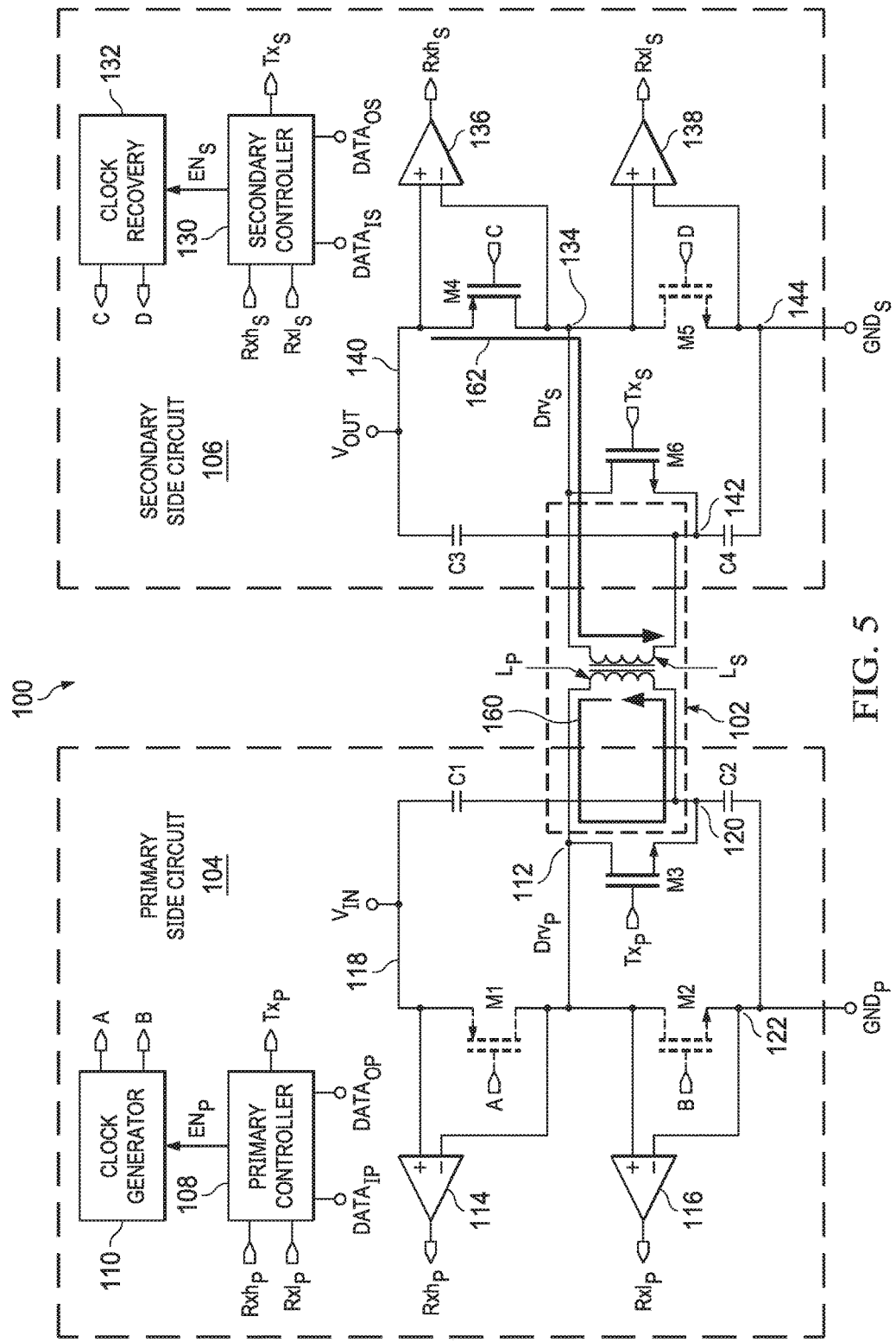
FIG. 5 is a circuit diagram of the system in FIG. 2 operating in a high primary data mode.
Figure 6:
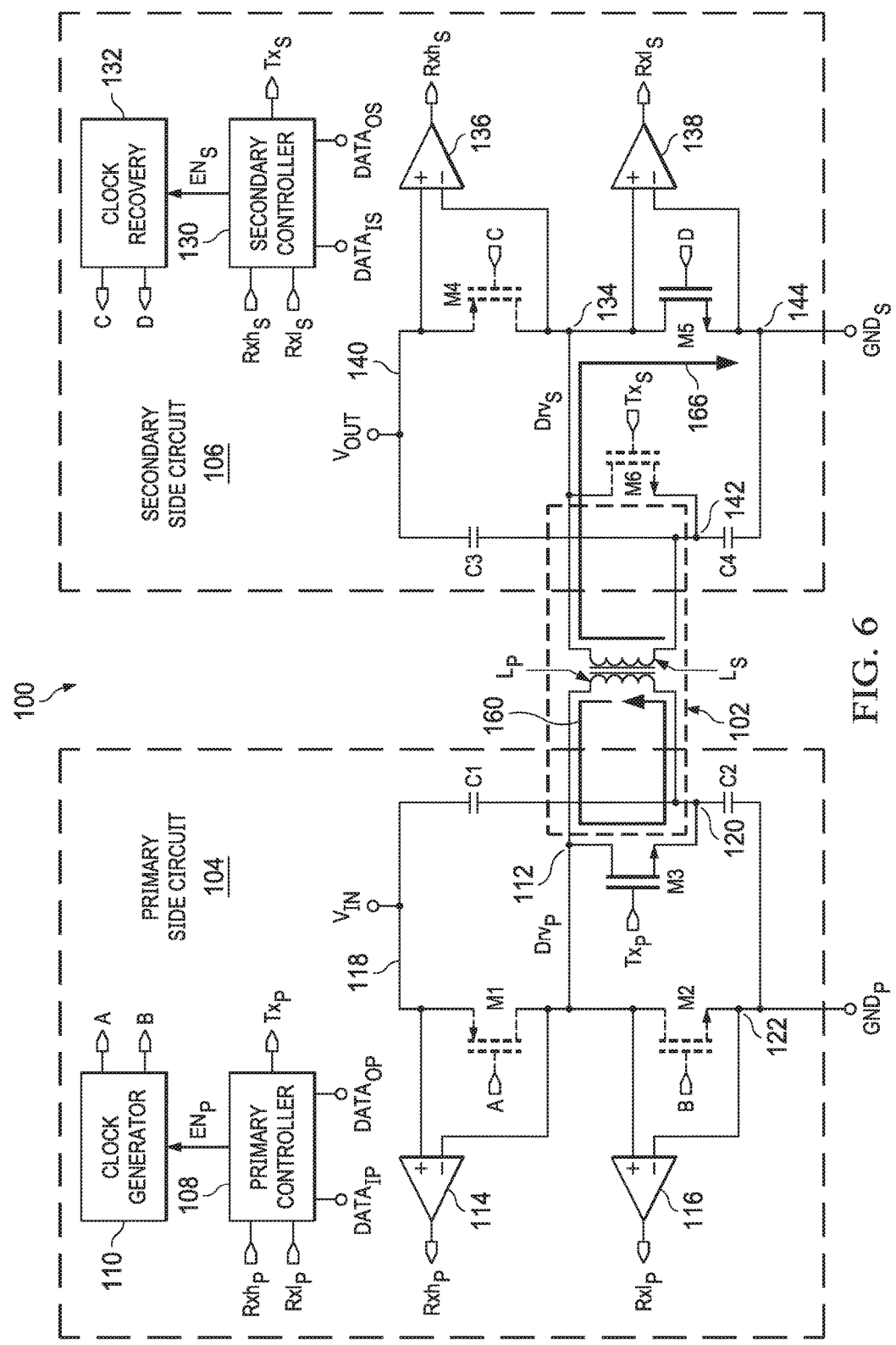
FIG. 6 is a circuit diagram of the system in FIG. 2 operating in a low primary data mode.

Referring back to FIG. 2, as noted, the system 100 also operates in a primary side data transmission mode. In the primary side data transmission mode, data is transferred from the primary side circuit 104 to the secondary side circuit 106. The primary controller 108 requests opening of a data transmission window for a predetermined number of clock cycles of a data transmission frequency. In at least one example, the data transmission frequency is the same frequency as the power transfer frequency. In other examples, the data transmission frequency is higher or lower than the power transfer frequency. FIGS. 5 and 6 illustrate an example of the system 100 operating in the primary side data transmission mode.

In particular, FIG. 5 illustrates the system 100 operating in the high side primary side data transmission mode, which is referred to as a "high primary data mode" for purposes of simplification of explanation. In the high primary data mode, it is presumed that signals C and D of the clock recovery circuit 132 in the secondary side circuit 106 have turned on the PMOS M4 (e.g., operating in saturation mode) and turned off the NMOS M5. Additionally, the NMOS M6 is turned off. Concurrently, to request opening of the data transmission window, the primary controller 108 de-asserts (e.g., logical '0') the enable signal provided to the clock generator 110, $EN_P$. In response, the clock generator 110 turns off the PMOS M1 and the NMOS M2. For example, the clock generator 110 outputs a logical '1' for signal A and a logical '0' for signal B. Accordingly, the primary side circuit 104 operates in a high impedance "high Z" state.

Additionally, the primary controller 108 turns on the NMOS M3 (e.g., by applying a logical '1' to the primary data transmission signal, $Tx_P$). Turning on the NMOS M3 shorts the first primary side node 112 with the second primary side node 120. That is, turning on NMOS M3 shorts the primary winding $L_P$. The shorting of the primary winding $L_P$ induces a current in the primary winding $L_P$ that is indicated by a line 160. The current indicated by the line 160 rises rapidly at a rate defined by a leakage inductance and a coupling factor of the transformer 102.

The rapidly rising current in the primary winding $L_P$ induces a current in the secondary winding $L_S$ that is indicated by a line 162. The current indicated by the line 162 reverses a current flowing from the drain to the source of the PMOS M4, which induces a drain-to-source voltage, $V_{DS}$ across the PMOS M4 that rises to a (data) threshold level. The drain-to-source voltage, $V_{DS}$ across the PMOS M4 is detected by the secondary high side op-amp 136 and the secondary high side op-amp 136 asserts (e.g., as a logical '1') the secondary high data receive signal, $Rxh_s$. In response to the assertion (e.g., logical '1') of the secondary high data receive signal, $Rxh_s$ the secondary controller 130 opens the data transmission window for a predetermined number of clock cycles of the power transmission clock. To open the data transmission window, the secondary controller 130 sets the enable signal, $EN_S$ to a hold state that holds signals C and D to states that keeps PMOS M4 turned on and NMOS M5 turned off.

During the data transmission window, the primary controller 108 modulates the primary data transmission signal, $TX_P$ to transmit encoded data (e.g., data provided by the data input signal, $DATA_{IP}$). The modulation of the primary data transmission signal, $TX_P$ induces a corresponding change in the drain-to-source voltage, $V_{DS}$ across the PMOS M4 that is detected by the secondary high side op-amp 136. During the data transmission window, the secondary controller 130 samples the output of the secondary high data receive signal, $Rxh_s$ at predetermined intervals until the end of the data transmission window. In at least one example, each clock pulse during the data transmission window (or some subset thereof) corresponds to a bit of data. In some examples, the encoded data can be transmitted from the primary side circuit 104 to the secondary side circuit 106 at a rate of up to about 1 Megabit per second (Mbps).

FIG. 6 illustrates the system 100 operating in the low side primary side data transmission mode, which is referred to as a "low primary data mode" for purposes of simplification of explanation. In the low primary data mode, the primary side circuit 104 operates in substantially the same manner as the high primary data mode to request a data transmission window that generates the rapidly rising current indicated by the line 160. Accordingly, the primary side circuit 104 operates in the high impedance "high Z" state.

Additionally, it is presumed that signals C and D of the clock recovery circuit 132 in the secondary side circuit 106 have turned off the PMOS M4 (e.g., operating in cutoff mode) and turned on the NMOS M5 (e.g., operating in saturation mode). Additionally, the NMOS M6 is turned off.

The rapidly rising current in the primary winding $L_P$ induces a current in the secondary winding $L_S$ that is indicated by a line 166. The current indicated by the line 166 reverses a current flowing from the drain to the source of the NMOS M5, which induces a drain-to-source voltage, $V_{DS}$ across the NMOS M5 that rises to the (data) threshold level. The drain-to-source voltage, $V_{DS}$ across the NMOS M5 is detected by the secondary low side op-amp 138 and the secondary low side op-amp 138 asserts (e.g., as a logical '1') the secondary low data receive signal, $Rxl_s$. In response to the assertion (e.g., logical '1') of the secondary low data receive signal, $Rxl_s$ the secondary controller 130 opens the data transmission window for the predetermined number of clock cycles. To open the data transmission window, the secondary controller 130 sets the enable signal, $EN_S$ to a hold state that holds signals C and D to states that keeps PMOS M4 turned off and NMOS M5 turned on.

During the data transmission window, the primary controller 108 modulates the primary data transmission signal, $TX_P$ to transmit encoded data (e.g., provided by the input data signal, $DATA_{IP}$) in substantially the same manner as the high primary data mode. The modulation of the primary data transmission signal, $TX_P$ induces a corresponding change in the drain-to-source voltage, $V_{DS}$ across the NMOS M6 that is detected by the secondary low side op-amp 138. During the data transmission window, the secondary controller 130 samples the output of the secondary low data receive signal, $Rxl_s$ at predetermined intervals until the end of the data transmission window. In at least one example, each clock pulse during the data transmission window (or some subset thereof) corresponds to a bit of data. Similar to the high primary data mode, data may be transmitted from the primary side circuit 104 to the secondary side circuit 106 at a rate of up to about 1 Mbps.

Referring back to FIG. 2, in some examples, the encoded data transmitted in either the high primary data mode or the low primary data mode can be transmitted from the primary side circuit 104 to the secondary side circuit 106 at a rate of up to about 1 Mbps. In some examples, the secondary controller 130 transmits the encoded data to an external component (e.g., another IC chip) via an output signal, $DATA_{OS}$. In other examples, the secondary controller 130 decodes the encoded data and subsequently transmits the encoded data to an external component via the output data signal, $DATA_{OS}$. In still other examples, the secondary controller 130 decodes the data received and employs the decoded data for local processing.

Upon termination of the data transmission window, the primary controller 108 re-asserts (e.g., logical '1') the enable signal, $EN_P$ and the secondary controller 130 reasserts (e.g., logical '1') the enable signal, $EN_S$ thereby returning the system 100 to operation in the power transfer mode.

Figure 7:
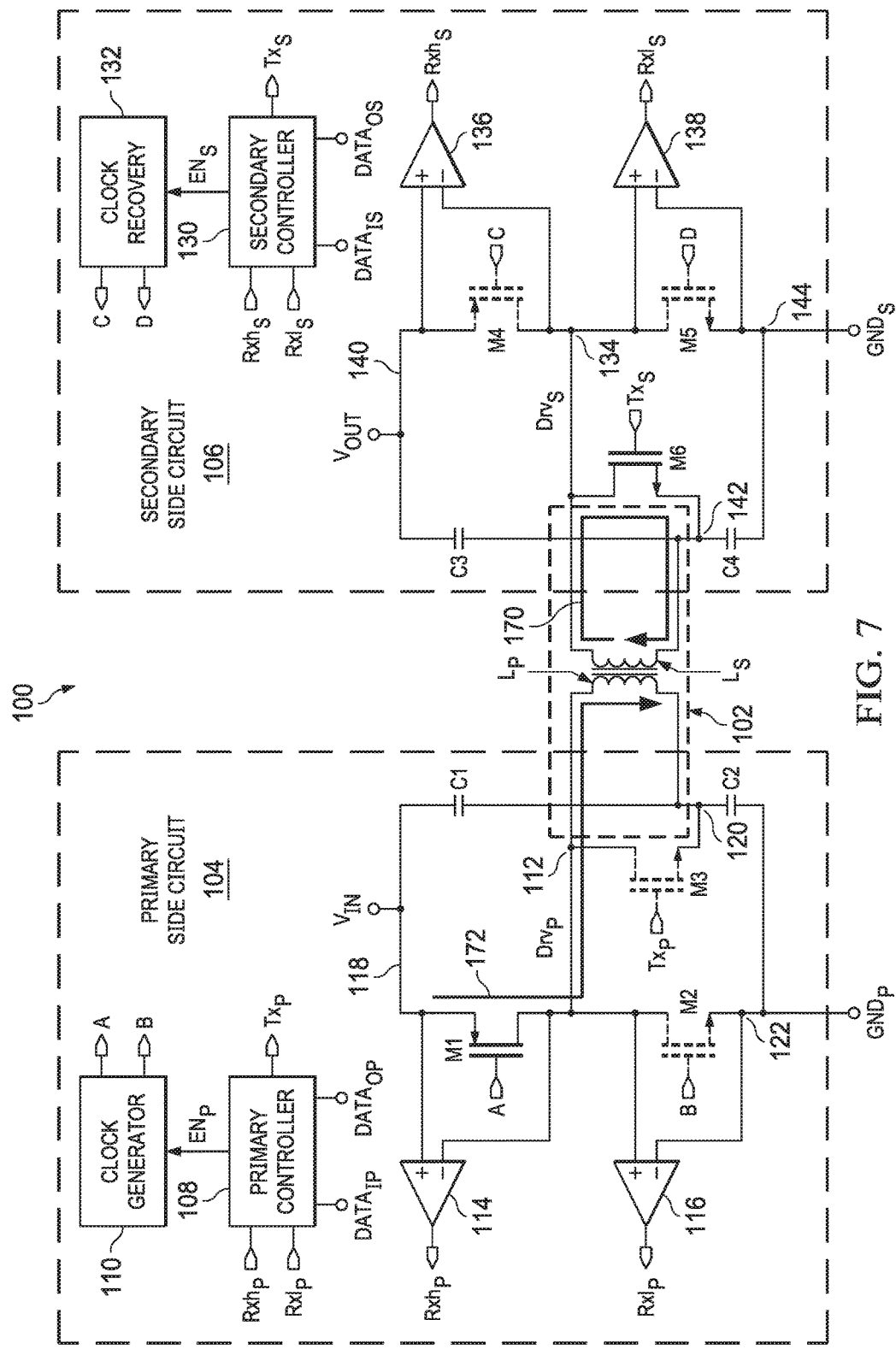
FIG. 7 is a circuit diagram of the system in FIG. 2 operating in a high secondary data mode.
Figure 8:
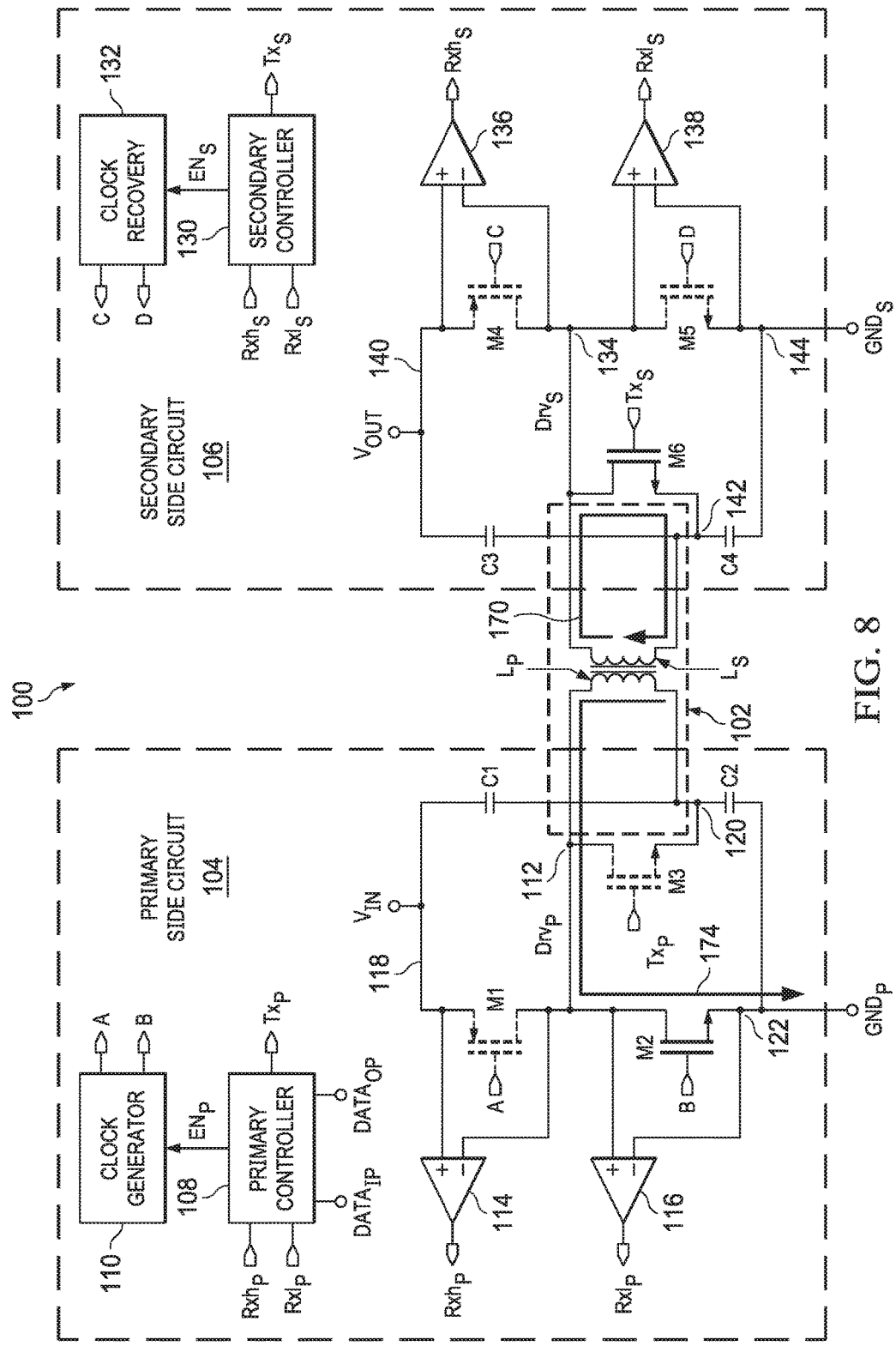
FIG. 8 is a circuit diagram of the system in FIG. 2 operating in a low secondary data mode.

As noted, the system 100 also operates in the secondary side data transmission mode. In the secondary side data transmission mode, data is transferred from the primary side circuit 104 to the secondary side circuit 106. The secondary controller 130 requests opening of a data transmission window for a predetermined number of clock cycles of a data transmission frequency. In at least one example, the data transmission frequency is the same frequency as the power transfer frequency. In other examples, the data transmission frequency is higher or lower than the power transfer frequency. FIGS. 7 and 8 illustrate an example of the system 100 operating in the secondary side data transmission mode.

In particular, FIG. 7 illustrates the system 100 operating in a high side secondary side data transmission mode, which is referred to as a "high secondary data mode" for purposes of simplification of explanation. In the high secondary data mode, it is presumed that signals A and B of the clock generator 110 in the primary side circuit 104 have turned on the PMOS M4 (e.g., operating in saturation mode) and turned off the NMOS M5. Additionally, the NMOS M6 is turned off. Concurrently, to request opening of the data transmission window, the secondary controller 130 de-asserts (e.g., logical '0') the enable signal provided to the clock recovery circuit 132, $EN_S$. In response, the clock recovery circuit 132 turns off the PMOS M4 and the NMOS M5. For example, the clock generator 110 outputs a logical '1' for signal A and a logical '0' for signal B. Accordingly, the primary side circuit 104 operates in a high impedance "high Z" state.

Additionally, the secondary controller 130 turns on the NMOS M6 (e.g., by applying a logical '1' to the secondary data transmission signal, $Tx_S$). Turning on the NMOS M6 shorts the first secondary side node 134 with the second secondary side node 142. That is, turning on NMOS M6 shorts the secondary winding $L_S$. The shorting of the secondary winding $L_S$ induces a current in the secondary winding $L_S$ that is indicated by a line 170. The current indicated by the line 170 rises rapidly at a rate defined by the leakage inductance and the coupling factor of the transformer 102.

The rapidly rising current in the secondary winding $L_S$ induces a current in the primary winding $L_P$ that is indicated by a line 172. The current indicated by the line 172 reverses a current flowing from the drain to the source of the PMOS M1, which induces a drain-to-source voltage, $V_{DS}$ across the PMOS M1 that rises to the (data) threshold level. The drain-to-source voltage, $V_{DS}$ across the PMOS M1 is detected by the primary high side op-amp 114 and the primary high side op-amp 114 asserts (e.g., as a logical '1') the primary high data receive signal, $Rxh_P$. In response to the assertion (e.g., logical '1') of the primary high data receive signal, $Rxh_P$ the primary controller 108 opens the data transmission window for the predetermined number of clock cycles. To open the data transmission window, the primary controller 108 sets the enable signal, $EN_P$ to a hold state that holds signals A and B to states that keeps PMOS M1 turned on and the NMOS M2 turned off.

During the data transmission window, the secondary controller 130 modulates the secondary data transmission signal, $TX_S$ to transmit encoded data (e.g., data provided on the data input signal, $DATA_{IS}$). The modulation of the secondary data transmission signal, $TX_S$ induces a corresponding change in the drain-to-source voltage, $V_{DS}$ across the PMOS M1 that is detected by the primary high side op-amp 114. During the data transmission window, the primary controller 108 samples the output of the primary high data receive signal, $Rxh_P$ at predetermined intervals until the end of the data transmission window. In at least one example, each clock pulse during the data transmission window (or some subset thereof) corresponds to a bit of data. In some examples, the encoded data can be transmitted from the secondary side circuit 106 to the primary side circuit 104 at a rate of up to about 1 Mbps.

FIG. 8 illustrates the system 100 operating in the low secondary side data transmission mode, which is referred to as a "low secondary data mode" for purposes of simplification of explanation. In the low secondary data mode, the secondary side circuit 106 operates in substantially the same manner as the high secondary data mode to request a data transmission window that generates the rapidly rising current indicated by the line 170. Accordingly, the primary side circuit 104 operates in the high impedance "high Z" state.

Additionally, it is presumed that signals A and B of the clock generator 110 in the primary side circuit 104 have turned off the PMOS M1 (e.g., operating in cutoff mode) and turned on the NMOS M1 (e.g., operating in saturation mode). Additionally, the NMOS M3 is turned off.

The rapidly rising current in the secondary winding $L_S$ induces a current in the primary winding $L_P$ that is indicated by a line 174. The current indicated by the line 174 reverses a current flowing from the drain to the source of the NMOS M2, which induces a drain-to-source voltage, $V_{DS}$ across the NMOS M2 that rises to the (data) threshold level. The drain-to-source voltage, $V_{DS}$ across the NMOS M2 is detected by the primary low side op-amp 116 and the primary low side op-amp 116 asserts (e.g., as a logical '1') the primary low data receive signal, $Rxl_P$. In response to the assertion (e.g., logical '1') of the primary low data receive signal, the primary controller 108 opens the data transmission window for a predetermined number of clock cycles of the power transmission clock. To open the data transmission window, the primary controller 108 sets the enable signal, $EN_P$ to a hold state that holds signals A and B to states that keeps PMOS M1 turned off and the NMOS M2 turned on.

During the data transmission window, the secondary controller 130 modulates the secondary data transmission signal, $TX_S$ to transmit encoded data in substantially the same manner as the high secondary data mode. The modulation of the secondary data transmission signal, $TX_S$ induces a corresponding change in the drain-to-source voltage, $V_{DS}$ across the PMOS M1 that is detected by the primary low side op-amp 116. During the data transmission window, the primary controller 108 samples the output of the secondary low data receive signal, $Rxl_s$ at predetermined intervals until the end of the data transmission window. In at least one example, each clock pulse during the data transmission window (or some subset thereof) corresponds to a bit of data. Similar to the high secondary data mode, data may be transmitted from the secondary side circuit 106 to the primary side circuit 104 at a rate of up to about 1 Mbps.

Referring back to FIG. 2, in some examples, the encoded data transmitted in either the high primary data mode or the low primary data mode can be transmitted from the secondary side circuit 106 to the primary side circuit 104 at a rate of up to about 1 Mbps. In some examples, the primary controller 109 transmits the encoded data to an external component (e.g., another IC chip) via a data output signal, $DATA_{OP}$. In other examples, the secondary controller 130 decodes the encoded data and subsequently transmits the encoded data to an external component via the data output signal, $DATA_{OP}$. In still other examples, the primary controller 108 decodes the data received and employs the decoded data for local processing.

Upon termination of the data transmission window, the primary controller 108 re-asserts (e.g., logical '1') the enable signal, $EN_P$ and the secondary controller 130 reasserts (e.g., logical '1') the enable signal, $EN_S$ thereby returning the system 100 to operation in the power transfer mode.

As illustrated in FIGS. 5-8, the system 100 allows for bi-directional data communication between the primary side circuit 104 and the secondary side circuit 106. That is, the system 100 allows data to be transmitted from the primary side circuit 104 to the secondary side circuit 106 or from the secondary side circuit 106 to the primary side circuit 104. In this manner, the same transformer 102 is employed in the power transfer mode, the primary data transmission mode and the secondary data transmission mode.

Figure 9:
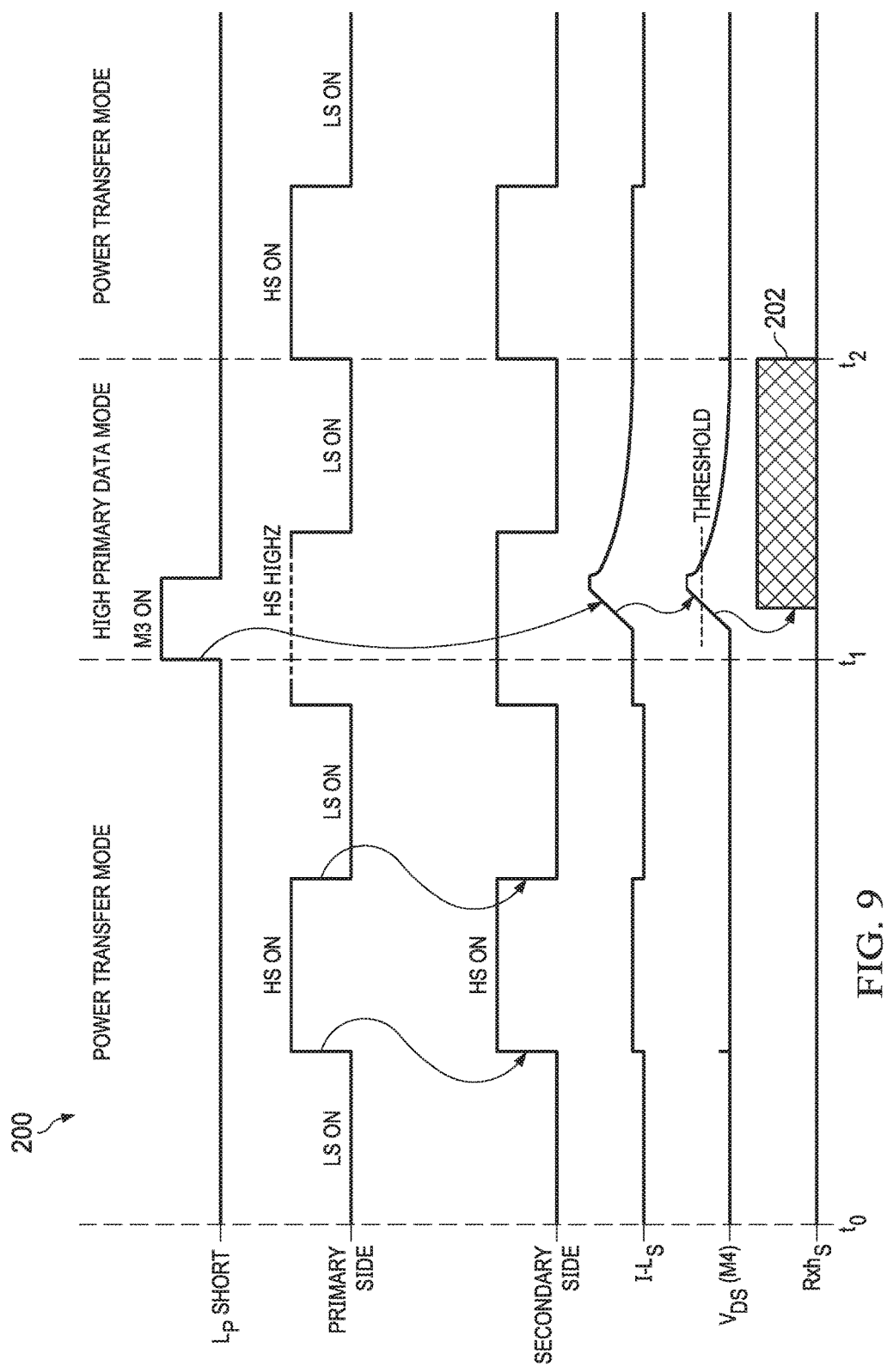
FIG. 9 is a timing diagram depicting example waveforms of the circuit of FIG. 2 operating in the high primary data mode.

FIG. 9 illustrates a timing diagram 200 of an example of waveforms that demonstrate operation of the system 100 of FIG. 2 in the high primary data mode. The waveforms of the low primary data mode, the high secondary data mode and the low secondary data mode are similar to the waveforms illustrated in the timing diagram 200.

In the timing diagram 200, from time $t_0$ to $t_1$ and after time $t_2$ the system 100 operates in the power transfer mode. In the power transfer mode, a waveform labeled "PRIMARY SIDE" denotes a state of the primary side circuit 104 and a waveform labeled "SECONDARY SIDE" denotes a state of the secondary side circuit 106. In particular, in a low-side on state labeled, "LS ON" in FIG. 9, the NMOSs M2 and M5 are turned on (operating in the saturation mode) and the PMOSs M1 and M4 are turned off (operating in the cutoff mode). Conversely, in a high-side on state labeled "HS ON", the PMOS M1 and M4 are turned on and the NMOSs M2 and M5 are turned off.

The timing diagram 200 also includes a shorting state of the primary winding $L_P$ (labeled as "$L_P$ SHORT" in FIG. 9). Between times $t_1$ and $t_2$, the system 100 operates in the high primary data mode. In particular, at time $t_1$, the primary data transmit signal, $Tx_P$ is asserted (e.g., logical '1') and the NMOS M3 turns on, (labeled as "M3 ON"), thereby shorting the primary winding $L_P$. Additionally, the primary side switches to the high impedance state (labeled as "HS HIGHZ" in FIG. 9), where PMOS M1 and PMOS M3 are turned off.

Shorting the primary winding $L_P$ induces a rapidly rising current on the secondary winding $L_S$ (labeled "I-$L_S$" in FIG. 9). The rapidly rising current induces a drain-to-source voltage ($V_{DS}$) drop across PMOS M4 (labeled as "$V_{DS}$ (M4)" in FIG. 9). Upon reaching a threshold voltage, the secondary high data receive signal (labeled "$Rxh_s$" in FIG. 9) is asserted to open a data transmission window 202 for a predetermined number of clock cycles. During the data transmission window, the primary side data transmit signal, $Tx_P$ is modulated to provide data that is detected by the secondary controller 130. Upon expiration of the data transmission window at time $t_2$, the system 100 returns to the power transfer mode.

Referring back to FIG. 2, in the primary side data transmission mode and the secondary side data transmission mode in some examples, the primary controller 108 and/or the secondary controller 130 executes an echo operation. The echo operation reduces excitation of the transformer 102 that increases power efficiency and/or increases a data transmission rate of the system 100.

Figure 10:
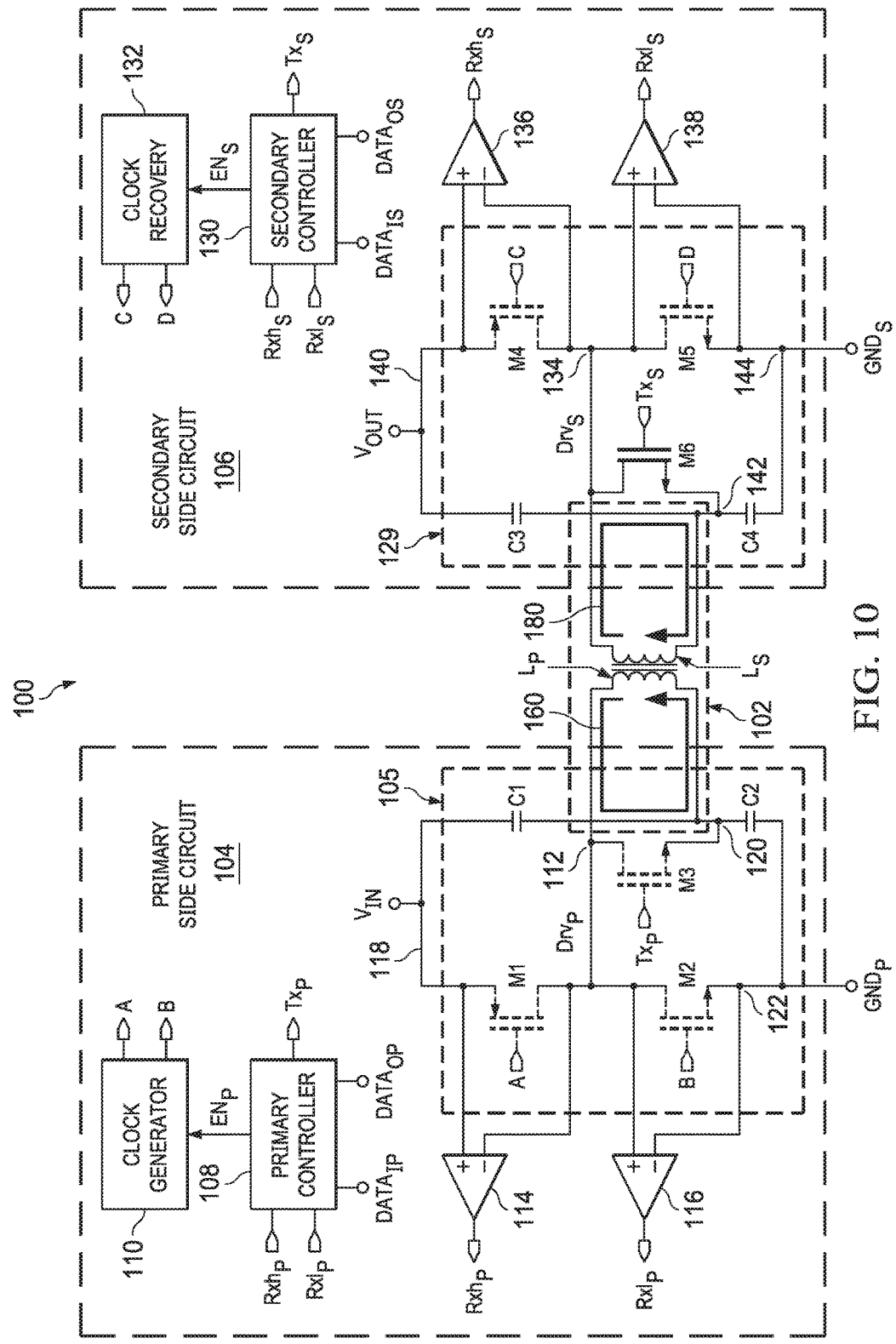
FIG. 10 is a circuit diagram of the system in FIG. 2 operating in a primary data transmit mode during an echo operation.

FIG. 10 illustrates the system 100 operating in the high primary data mode or the low primary data mode with an echo operation. In particular, the primary side circuit 104 induces the current indicated by the line 160 to open the data window in a manner illustrated and described with respect to FIG. 5 or FIG. 6. Upon opening the data window, the secondary controller 130 switches the half-wave rectifier 129 of the secondary side circuit 106 into the high impedance (High Z) state. In such a situation, the secondary controller 130 causes the clock recovery circuit 132 to output signals C and D to turn off PMOS M4 and NMOS M5 (operate in the cutoff mode). Additionally, the secondary controller 130 controls the secondary transmission signal, $TX_S$ to turn on the NMOS M6 (operate in the saturation mode). Turning on the NMOS M6 shorts the secondary winding $L_S$ (shorting the first secondary side node 134 with the second secondary side node 142) to induce a current indicated by a line 180, echoing the state of the primary winding $L_P$.

Accordingly, the half-wave driver 105 of the primary side circuit 104 and the half-wave rectifier 129 of the secondary side circuit 106 are operating in the high impedance (High Z) state and both the primary winding $L_P$ and the secondary winding $L_S$ of the transformer 102 are shorted. Additionally, the data modulated on the primary side data transmission signal, $TX_P$ is detected at the secondary high side op-amp 136 or at the secondary low side op-amp 138 in the manner described herein. Additionally, because the primary winding $L_P$ and the secondary winding $L_S$ are shorted, the transformer 102 avoids further rise in the current at the secondary side driver signal, $Drv_S$, such that additional (excess) current dissipation is reduced during the primary side data transmission mode.

Figure 11:
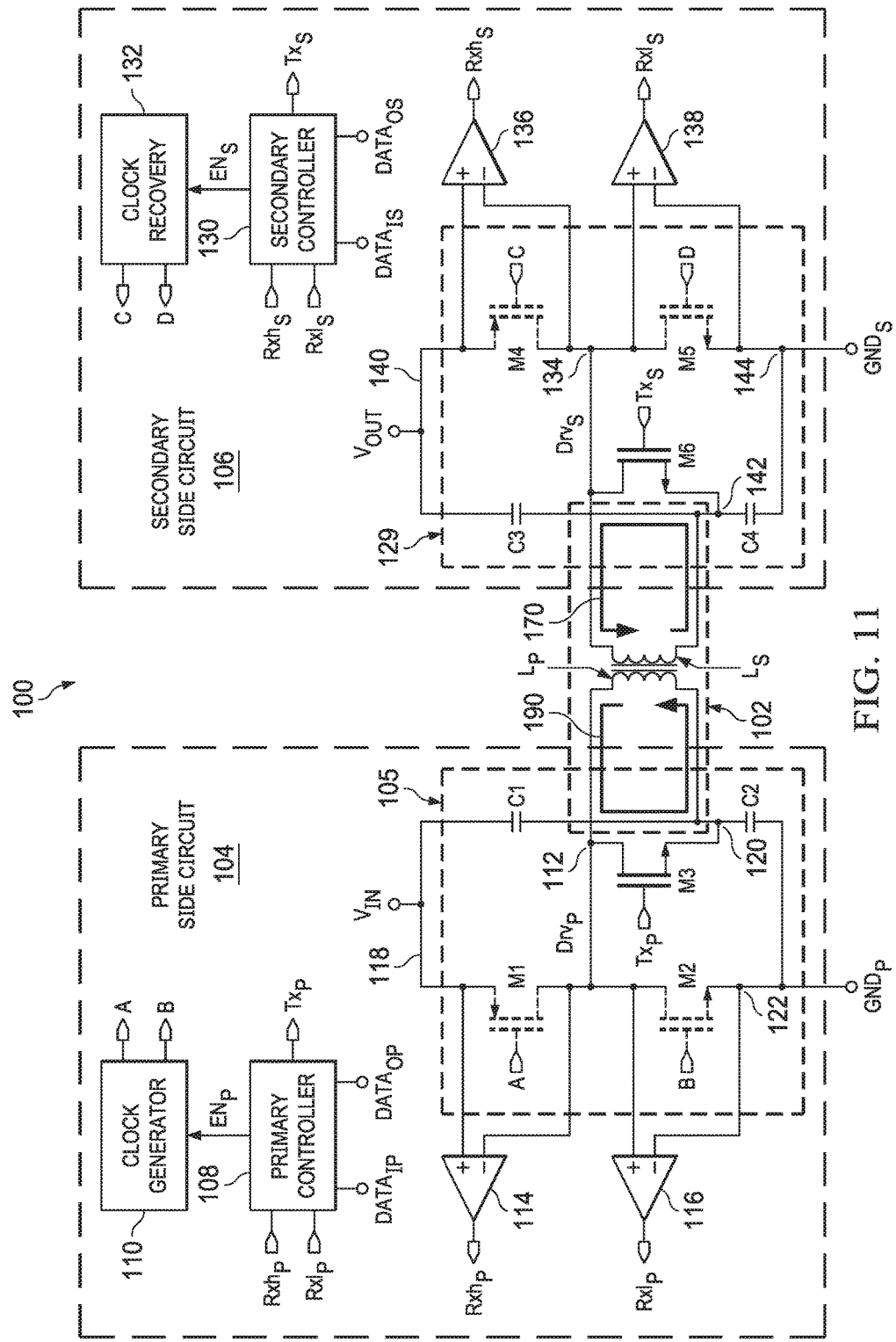
FIG. 11 is a circuit diagram of the system in FIG. 2 operating in a secondary data transmit mode during an echo operation.

FIG. 11 illustrates the system 100 operating in the high secondary data mode or the low secondary data mode with an echo operation. In particular, the secondary side circuit 106 induces the current indicated by the line 170 to open the data window in a manner illustrated and described with respect to FIG. 7 or FIG. 8. Upon opening the data window, the primary controller 108 switches the half-wave driver 105 of the primary side circuit 104 into the high impedance (High Z) state. In such a situation, the primary controller 108 causes the clock generator 110 to output signals A and B to turn off PMOS M1 and NMOS M2 (operate in the cutoff mode). Additionally, the primary controller 108 controls the primary data transmission signal, $TX_P$ to turn on the NMOS M3 (operate in the saturation mode). Turning on NMOS M3 shorts the primary winding $L_P$ to induce a current indicated by a line 190, echoing the state of the secondary winding $L_S$.

Accordingly, the half-wave driver 105 of the primary side circuit 104 and the half-wave rectifier 129 secondary side circuit 106 are operating in the high impedance (High Z) state and both the primary winding $L_P$ and the secondary winding $L_S$ of the transformer 102 are shorted. Additionally, the data modulated on the secondary side data transmission signal, $TX_S$ is detected at the primary high side op-amp 114 or at the primary low side op-amp 116 in the manner described herein. Additionally, because the primary winding $L_P$ and the secondary winding $L_S$ are shorted, the transformer 102 avoids further rise in the current at the primary side driver signal, $Drv_P$, such that additional (excess) current dissipation is reduced during the primary side data transmission mode.

Figure 12:
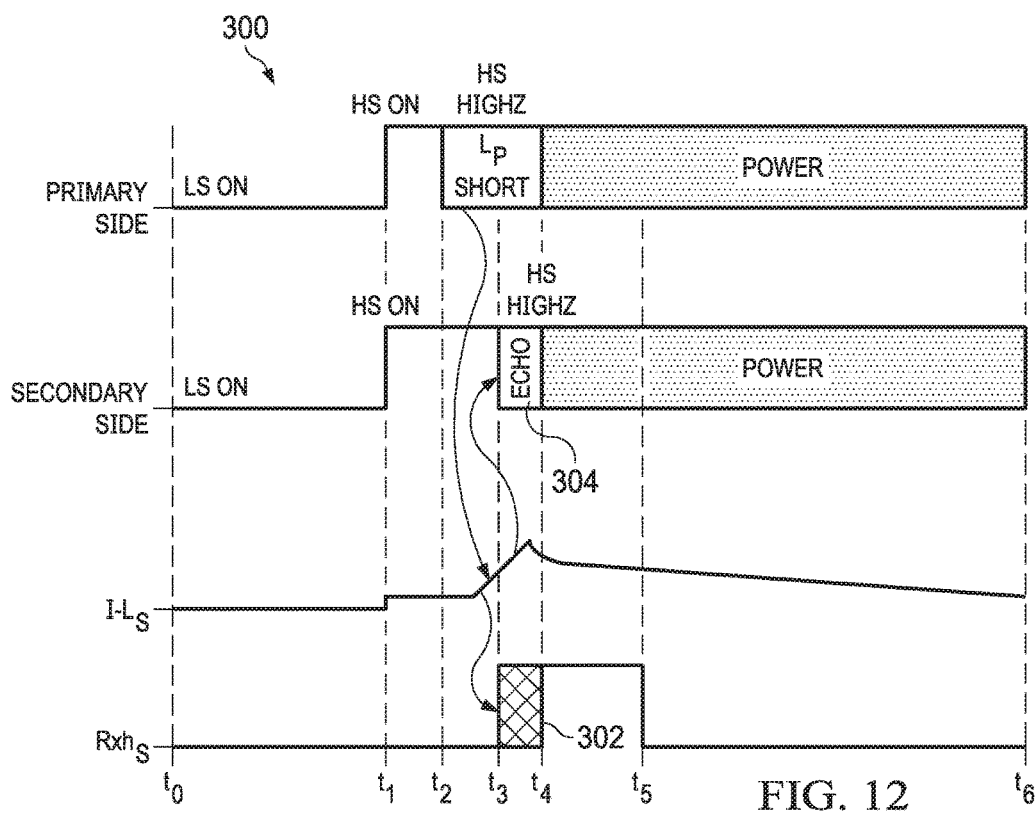
FIG. 12 is a timing diagram depicting example waveforms of the circuit of FIG. 2 executing an echo operating in the high primary data mode.

FIG. 12 illustrates a timing diagram 300 of an example of waveforms that demonstrate a given echo operation of the system 100 of FIG. 2 in the high primary data mode. The waveforms of the low primary data mode, the high secondary data mode and the low secondary data mode are similar to the timing diagram 200.

In the timing diagram 300, from time $t_0$ until time $t_2$ and from time $t_5$ until time $t_6$ the system 100 operates in the power transfer mode. In the power transfer mode, a waveform labeled "PRIMARY SIDE" denotes a state of the primary side circuit 104 and a waveform labeled "SECONDARY SIDE" denotes a state of the secondary side circuit 106. In particular, in a low-side on state labeled, "LS ON" in FIG. 12, the NMOSs M2 and M5 are turned on (operating in the saturation mode) and the PMOSs M1 and M4 are turned off (operating in the cutoff mode). Conversely, in a high-side on state labeled "HS ON", the PMOS M1 and M4 are turned on and the NMOSs M2 and M5 are turned off.

The timing diagram 300 also includes a shorting state of the primary winding $L_P$ (labeled as "$L_P$ SHORT" in FIG. 11). Between times $t_2$ and $t_4$, the system 100 operates in the high primary data mode. In particular, at time $t_2$, the primary data transmit signal, $Tx_P$ is asserted (e.g., logical '1') and the NMOS M3 turns on, (labeled as "M3 ON"), thereby shorting the primary winding $L_P$. Additionally, the primary side switches to the high impedance state (labeled as "HS HIGHZ" in FIG. 12), where PMOS M1 and PMOS M3 are turned off.

Shorting the primary winding $L_P$ induces a rapidly rising current on the secondary winding $L_S$ (labeled "I-$L_S$" in FIG. 12). The rapidly rising current causes a secondary high data receive signal (labeled "$Rxh_s$" in FIG. 12) is be asserted (e.g., logical '1') to open a data transmission window 302 for a predetermined number of clock cycles. During the data transmission window 302, the primary side data transmit signal, $Tx_P$ is modulated to provide data that is detected by the secondary controller 130.

Additionally, starting at time $t_3$, the secondary controller 130 executes an echo operation that asserts (e.g., logical '1') the secondary data transmission signal, $Tx_s$ that shorts the secondary winding $L_S$ during the window indicated by 304. Additionally, at time $t_4$, the primary controller de-asserts (e.g., logical '0') the primary side data transmission signal, $Tx_P$ thereby de-shorting the primary winding $L_P$. In response, the secondary controller 130 de-asserts (e.g., logical '0') the secondary data transmission signal, $Tx_s$ to de-short the secondary winding $L_s$. Additionally, the current in the secondary winding, I-$L_S$ decays to a level, the level during the power transfer mode. Additionally, shortly after time $t_4$, the system 100 returns to the power transfer mode (indicated by in FIG. 4 as "POWER"). At time $t_5$, the secondary high data receive signal, $Rxh_s$ returns to a low state (e.g., logical '0').

Upon expiration of the data transmission window at time $t_2$, the system 100 returns to the power transfer mode. By executing the given echo operation in the manner illustrated by the timing diagram 200, the system 100 is tuned to improve power efficiency. In particular, by shorting the secondary winding $L_S$ during the window 304, power loss due to excess current at the secondary side circuit 106 is reduced.

Figure 13:
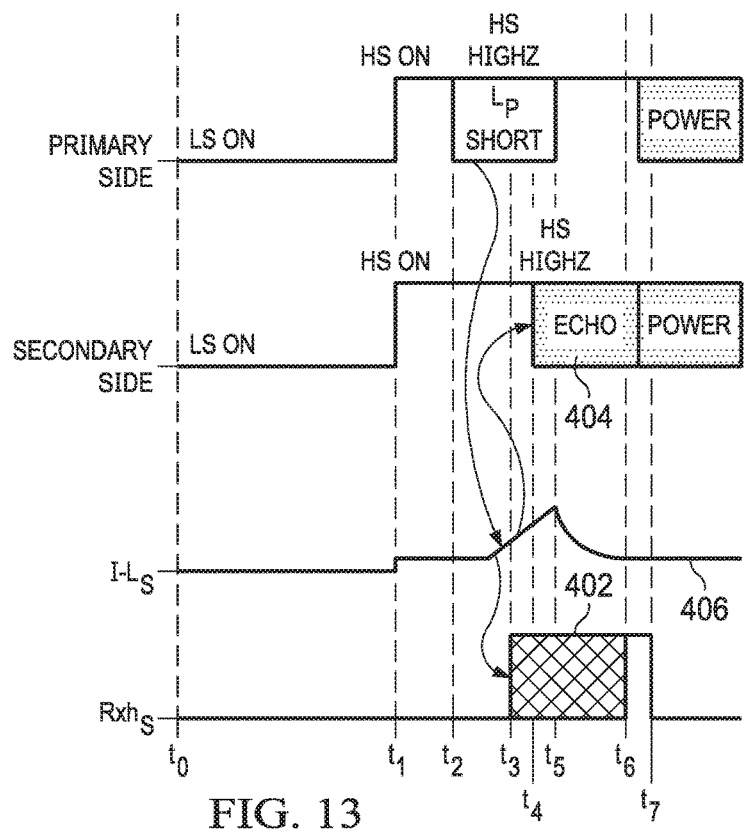
FIG. 13 is another timing diagram depicting example waveforms of the circuit of FIG. 2 executing an echo operating in the high primary data mode.

FIG. 13 illustrates a timing diagram 400 of an example of waveforms that demonstrate another echo operation of the system 100 of FIG. 2 in the high primary data mode. The waveforms of the low primary data mode, the high secondary data mode and the low secondary data mode are similar to the timing diagram 400.

In the timing diagram 400, from time $t_0$ until time $t_2$ and after time $t_7$ the system 100 operates in the power transfer mode. In the power transfer mode, a waveform labeled "PRIMARY SIDE" denotes a state of the primary side circuit 104 and a waveform labeled "SECONDARY SIDE" denotes a state of the secondary side circuit 106. In particular, in a low-side on state labeled, "LS ON" in FIG. 13, the NMOSs M2 and M5 are turned on (operating in the saturation mode) and the PMOSs M1 and M4 are turned off (operating in the cutoff mode). Conversely, at time $t_1$ the system 100 operates in a high-side on state labeled "HS ON", the PMOS M1 and M4 are turned on and the NMOSs M2 and M5 are turned off.

The timing diagram 400 also includes a shorting state of the primary winding $L_P$ (labeled as "$L_P$ SHORT" in FIG. 13). Between times $t_2$ and $t_6$, the system 100 operates in the high primary data mode. In particular, at time $t_2$, the primary data transmit signal, $Tx_P$ is asserted (e.g., logical '1') and the NMOS M3 turns on, (labeled as "M3 ON"), thereby shorting the primary winding $L_P$. Additionally, the primary side switches to the high impedance state (labeled as "HS HIGHZ" in FIG. 13), where PMOS M1 and PMOS M3 are turned off.

Shorting the primary winding $L_P$ induces a rapidly rising current on the secondary winding $L_S$ (labeled "I-$L_S$" in FIG. 13). The rapidly rising current causes a secondary high data receive signal (labeled "$Rxh_s$" in FIG. 13) is be asserted (e.g., logical '1') to open a data transmission window 402 for a predetermined number of clock cycles. During the data transmission window 402, the primary side data transmit signal, $Tx_P$ is modulated to provide data that is detected by the secondary controller 130.

Additionally, starting at time $t_4$, the secondary controller 130 executes the other echo operation that asserts (e.g., logical '1') the secondary data transmission signal, $Tx_s$ that shorts the secondary winding $L_S$ during the window indicated by 404. Additionally, at time $t_5$, the primary controller de-asserts (e.g., logical '0') the primary side data transmission signal, $Tx_P$ thereby de-shorting the primary winding $L_P$. In response, at time $t_6$, the secondary controller 130 de-asserts (e.g., logical '0') the secondary data transmission signal, $Tx_s$ to de-short the secondary winding $L_S$ in response to the secondary winding current I-$L_S$ decaying to a level prior to the shorting of the primary winding $L_P$ noted with reference number 406. In the other echo operation, the secondary winding $L_S$ and the primary winding $L_P$ are shorted for about the same amount of time (e.g., within about 1 microsecond). Additionally, shortly after time $t_5$, at time $t_7$ the system 100 returns to the power transfer mode (indicated by in FIG. 4 as "POWER"). At time $t_7$, the secondary high data receive signal, $Rxh_s$ returns to a low state (e.g., logical '0').

Upon expiration of the data transmission window at time $t_6$, the system 100 returns to the power transfer mode. By executing the other echo operation in the manner illustrated by the timing diagram 200, the system 100 is tuned to improve power efficiency and increase bandwidth. In particular, by shorting the secondary winding $L_S$ during the window 304, power loss due to excess current at the secondary side circuit 106 is reduced. Additionally, as compared to the given echo operation illustrated by the timing diagram 200 in FIG. 12, the other echo operation increases a duration of the data transmission window by matching a duration of shorting of the primary winding $L_P$ with the duration of the shorting the secondary winding $L_S$.

Referring back to FIG. 2, as described, the system 100 allows the same transformer 102 to be employed in the power transfer mode, the primary data transmission mode and the secondary data transmission mode. Accordingly, the system 100 obviates the need for separate transformers or other signal couplers for power transfer and data transfer. Thus, the system 100 can achieve space and cost savings by eliminating the need for a (relatively large and expensive) second transformer and/or signal coupler.

Figure 14:
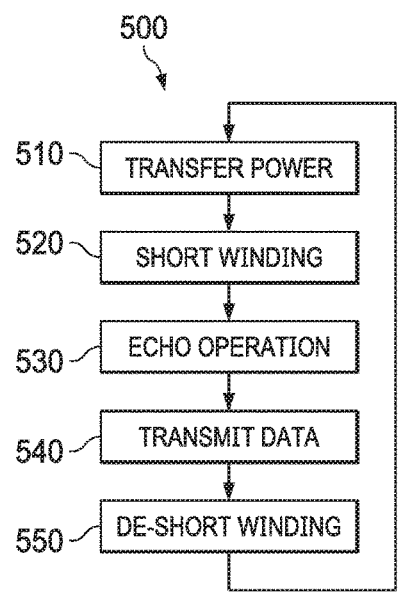
FIG. 14. is a flowchart of an example method of transferring power and transmitting data via a transformer.

In view of the foregoing structural and functional features described above, an example method will be better appreciated with reference to FIG. 14. While, for purposes of simplicity of explanation, the example method of FIG. 14 is shown and described as executing serially, it is to be understood and appreciated that the present examples are not limited by the illustrated order, as some actions could in other examples occur in different orders, multiple times and/or concurrently from that shown and described herein. Moreover, it is not necessary that all described actions be performed to implement a method.

FIG. 14 illustrates a flowchart of an example method 500 for transferring power and transmitting data over a transformer. The method 500 could be implemented, for example, by the system 50 of FIG. 1 and/or the system 100 illustrated in FIG. 2.

At 510, the system transfers power from a given side circuit (e.g., a given one of the primary side circuit 58 and the secondary side circuit 60) to another side circuit (e.g., the other of the primary side circuit and the secondary side circuit) coupled to the transformer. That is, at 510, the system operates in the power transfer mode.

At 520, a given controller (e.g., a given one of the primary controller 62 or the secondary controller 64 of FIG. 1) shorts a given winding of the given side of the transformer is shorted to indicate a request for opening of a data transmission window. At 530, another controller (e.g., the other of the primary controller the secondary controller of FIG. 1) executes an echo operation that shorts another winding of the other side of the transformer in response to opening the data transmission window. At 540, the data is transmitted from the given side circuit to the other side circuit via the transformer. That is, at 520-540, the system operates in the primary data transfer mode or the secondary data transfer mode. At 550, the given winding is de-shorted and the method returns to 510.

In this description, the term "based on" means based at least in part on. Modifications are possible in the described embodiments, and other embodiments are possible, within the scope of the claims.

What is claimed is:

1. A system comprising:
    a transformer comprising: a primary winding having a first and second primary terminals; and a secondary winding having a first and second secondary terminals;
    a primary side circuit coupled to the first and second primary terminals, the primary side circuit comprising a primary controller; and
    a secondary side circuit coupled to the first and second secondary terminals, the secondary side circuit comprising a secondary controller, and the secondary controlled configured to receive data from the primary controller via the transformer;

the primary controller configured to: cause the primary side circuit to transfer power to the secondary side circuit via the transformer; and by selectively coupling the first primary terminal to the second primary terminal, request a data transmission window for the primary controller to transmit the data to the secondary controller via the transformer.

2. The system of claim 1, wherein the primary controller is configured to: by selectively coupling the first primary terminal to the second primary terminal, induce an increase in current at the first secondary terminal.

3. The system of claim 2, wherein the secondary side circuit includes a transistor having an input node and an output node, and the primary controller is configured to: by selectively coupling the first primary terminal to the second primary terminal, induce a voltage between the input node and the output node.

4. The system of claim 3, wherein the secondary side circuit includes a detector circuit having a detector output and first and second detector inputs, the first detector input coupled to the input node, the second detector input coupled to the output node, the detector output coupled to the secondary controller, and the detector circuit configured to provide at the detector output a signal indicative of the induced voltage.

5. The system of claim 4, wherein the secondary controller is configured to open the data transmission window for a predetermined amount of time in response to the signal from the detector circuit.

6. The system of claim 5, wherein the primary controller is configured to: by modulating a primary data transmission signal, transmit the data to the secondary controller via the transformer during the data transmission window.

7. The system of claim 6, wherein the secondary controller is configured to close the data transmission window after the predetermined amount of time.

8. The system of claim 6, wherein the secondary controller is configured to selectively couple the first secondary terminal to the second secondary terminal in response to opening the data transmission window.

9. The system of claim 8, wherein: the primary controller is configured to selectively decouple the first primary terminal from the second primary terminal; and the secondary controller is configured to selectively decouple the first secondary terminal from the second secondary terminal in response to the first primary terminal being decoupled from the second primary terminal.

10. The system of claim 8, wherein: the primary controller is configured to selectively decouple the first primary terminal from the second primary terminal after a particular amount of time; and the secondary controller is configured to selectively decouple the first secondary terminal from the second secondary terminal after the particular amount of time.

11. The system of claim 1, wherein the primary side circuit is implemented on a first integrated circuit (IC) chip, and the secondary side circuit is implemented on a second IC chip.

12. A system comprising:
a transformer comprising: a primary winding having first and second primary terminals; and a secondary winding having first and second secondary terminals;
a primary side circuit coupled to the first and second primary terminals, the primary side circuit comprising:
a primary controller; and
a clock generator configured to generate a first pair of signals oscillating at a predetermined frequency; and
a secondary side circuit coupled to the first and second secondary terminal, the secondary side circuit comprising:
a secondary controller configured to: receive first data from the primary controller via the transformer; and transmit second data to the primary controller via the transformer; and
a clock recovery circuit configured to generate a second pair of signals oscillating at the predetermined frequency; and
the primary controller configured to: cause the primary side circuit to transfer power to the secondary side circuit via the transformer; and by selectively coupling the first primary terminal to the second primary terminal, request a first data transmission window for the primary controller to transmit the first data to the secondary controller via the transformer; and
the secondary controller configured to: by selectively coupling the first secondary terminal to the second secondary terminal, request a second data transmission window for the secondary controller to transmit the second data to the primary controller via the transformer.

13. The system of claim 12, wherein the clock generator and the clock recovery circuit are configured to operate in a phase locked-loop relationship.

14. The system of claim 12, wherein the secondary side circuit includes a transistor having an input node and an output node, and the primary controller is configured to: by selectively coupling the first primary terminal to the second primary terminal, induce a voltage between the input node and the output node.

15. The system of claim 14, wherein the secondary controller is configured to detect the induced voltage and selectively couple the first secondary terminal to the second secondary terminal in response to detecting the induced voltage.

16. A method comprising:
transferring power from a first winding of a transformer to a second winding of a transformer;
shorting the first winding of the transformer to induce a rising current on the second winding of the transformer;
transmitting data from the first winding to the second winding during a data transmission window that is opened in response to the induced rising current; and
shorting, in an echo operation, the second winding in response to opening the data transmission window.

17. The method of claim 16, wherein the data is first data, and the method further comprises:
de-shorting the first winding of the transformer;
shorting the second winding of the transformer; and
transmitting second data from the second winding to the first winding.

* * * * *